(12) United States Patent
Kim et al.

(10) Patent No.: US 10,224,341 B2
(45) Date of Patent: Mar. 5, 2019

(54) VERTICAL SEMICONDUCTOR DEVICES

(71) Applicant: SAMSUNG ELECTRONICS CO., LTD., Suwon-si, Gyeonggi-do (KR)

(72) Inventors: Kwang-Soo Kim, Hwaseong-si (KR); Tae-Seok Jang, Anyang-si (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 15/636,729

(22) Filed: Jun. 29, 2017

(65) Prior Publication Data

US 2018/0182775 A1 Jun. 28, 2018

(30) Foreign Application Priority Data

Dec. 22, 2016 (KR) .................. 10-2016-0176459

(51) Int. Cl.
  *H01L 27/11582* (2017.01)
  *H01L 23/522* (2006.01)
  *H01L 27/1157* (2017.01)
  *H01L 27/11565* (2017.01)
  *H01L 27/11573* (2017.01)

(52) U.S. Cl.
  CPC .... *H01L 27/11582* (2013.01); *H01L 23/5226* (2013.01); *H01L 27/1157* (2013.01); *H01L 27/11565* (2013.01); *H01L 27/11573* (2013.01)

(58) Field of Classification Search
  CPC ......... H01L 27/11582; H01L 27/11565; H01L 27/11573; H01L 23/5226
  See application file for complete search history.

(56) References Cited

U.S. PATENT DOCUMENTS

| | | |
|---|---|---|
| 8,107,289 B2 | 1/2012 | Shim et al. |
| 8,530,350 B2 | 9/2013 | Freeman et al. |
| 8,609,536 B1 | 12/2013 | Ha et al. |
| 8,659,070 B2 | 2/2014 | Tanaka et al. |
| 8,822,285 B2 | 9/2014 | Hwang et al. |
| 9,299,445 B2 | 3/2016 | Park et al. |
| 9,373,633 B2 | 6/2016 | Jin et al. |
| 9,419,009 B1 | 8/2016 | Oh et al. |
| 10,049,744 B2 * | 8/2018 | Jeong ................ H01L 27/11524 |

* cited by examiner

*Primary Examiner* — Trang Q Tran
(74) *Attorney, Agent, or Firm* — F. Chau & Associates, LLC

(57) ABSTRACT

A vertical semiconductor device includes odd and even cell blocks, and odd and even block pad structures. Each of the odd cell blocks includes first conductive line structures including conductive lines and insulation layers alternatively stacked in a first direction. Each of the even cell blocks includes second conductive line structures having substantially the same shape as the first conductive line structures. The odd block pad structure is connected to first edge portions of the first conductive line structures. The even block pad structure is connected to second edge portions, opposite the first edge portions, of the second conductive line structures. Each of the odd cell blocks and the even cell blocks has a first width in a third direction. Each of the odd and even block pad structures is formed on a region of a substrate having a second width greater than the first width in the third direction.

20 Claims, 18 Drawing Sheets

VERTICAL SEMICONDUCTOR DEVICES

CROSS-REFERENCE TO RELATED APPLICATION

This application claims priority under 35 U.S.C. § 119 to Korean Patent Application No. 10-2016-0176459 filed on Dec. 22, 2016 in the Korean Intellectual Property Office (KIPO), the disclosure of which is incorporated by reference herein in its entirety.

TECHNICAL FIELD

The present inventive concept relates to a vertical semiconductor device, and more particularly, to a vertical NAND flash memory device.

DISCUSSION OF THE RELATED ART

Vertical semiconductor devices having memory cells that are vertically stacked on an upper surface of a substrate are being developed. The memory cells may include a plurality of vertically stacked conductive lines. An edge portion of each of the conductive lines may be a pad region, and a wiring structure may be connected to the pad region. As the number of the vertically stacked memory cells increases, a horizontal area for forming the pad region may be increased.

SUMMARY

According to an exemplary embodiment of the present inventive concept, a vertical semiconductor device including a plurality of odd cell blocks each including a plurality of first conductive line structures on a substrate, wherein each of the first conductive line structures includes conductive lines and insulation layers alternatively stacked in a first direction substantially perpendicular to an upper surface of the substrate and extending in a second direction substantially parallel to the upper surface of the substrate. The vertical semiconductor device further includes a plurality of even cell blocks each including a plurality of second conductive line structures on the substrate between the odd cell blocks, wherein each of the second conductive line structures has substantially the same shape as that of each of the first conductive line structures, and extends in the second direction. The vertical semiconductor device additionally includes an odd block pad structure connected to first edge portions of the first conductive line structures on the substrate, and an even block pad structure connected to second edge portions of the second conductive line structures on the substrate. The second edge portions are opposite to the first edge portions, respectively, in the second direction. Each of the odd cell blocks and each of the even cell blocks has a first width in a third direction. The third direction is substantially parallel to the upper surface of the substrate and substantially perpendicular to the second direction, and each of the odd and even block pad structures is formed on a region of the substrate having a second width greater than the first width in the third direction.

According to an exemplary embodiment of the present inventive concept, a vertical semiconductor device including a plurality of odd cell blocks each including a plurality of first conductive line structures on a substrate, wherein each of the first conductive line structures includes conductive lines and insulation layers alternatively stacked in a first direction substantially perpendicular to an upper surface of the substrate and extending in a second direction substantially parallel to the upper surface of the substrate. The vertical semiconductor device further includes a plurality of even cell blocks each including a plurality of second conductive line structures on the substrate between the odd cell blocks, wherein each of the second conductive line structures has substantially the same shape as that of each of the first conductive line structures, and extends in the second direction. The vertical semiconductor device additionally includes an odd block pad structure aligned to the first and second conductive line structures, wherein the odd block pad structure is connected to a first edge portion of the first conductive line structure, and is spaced apart from a first edge portion of the second conductive line structure, and an even block pad structure aligned to the first and second conductive line structures. The even block pad structure is connected to a second edge portion of the second conductive line structure, and is spaced apart from a second edge portion of the first conductive line structure.

According to an exemplary embodiment of the present inventive concept, a vertical semiconductor device including a plurality of first cell blocks each including a plurality of first conductive line structures on a substrate, wherein each of the first conductive line structures extends in a second direction and includes conductive lines and insulating layers alternatively stacked in a first direction substantially perpendicular to the second direction. The vertical semiconductor device further includes a plurality of second cell blocks each including a plurality of second conductive line structures on the substrate between the first cell blocks, wherein each of the second conductive line structures includes conductive lines and insulating layers alternatively stacked in the first direction. The vertical semiconductor device additionally includes a first block pad structure extending in a third direction substantially perpendicular to the second direction and including a first, a second, a third and a fourth pad pattern structure connected to each other and the first conductive line structures, wherein the first conductive line structures and the first block pad structure have an "L" shape. The vertical semiconductor device additionally includes a second block pad structure extending in the third direction and including a fifth, a sixth, a seventh and an eighth pad pattern structure connected to each other and the second conductive line structures, wherein the second block pad structure is opposite the first block pad structure, and the second conductive line structures and the second block pad structure have an "L" shape.

BRIEF DESCRIPTION OF THE DRAWINGS

The above and other features of the present inventive concept will become more apparent by describing in detail exemplary embodiments thereof, with reference to the accompanying drawings, in which.

DETAILED DESCRIPTION OF THE EMBODIMENTS

Figure 1:
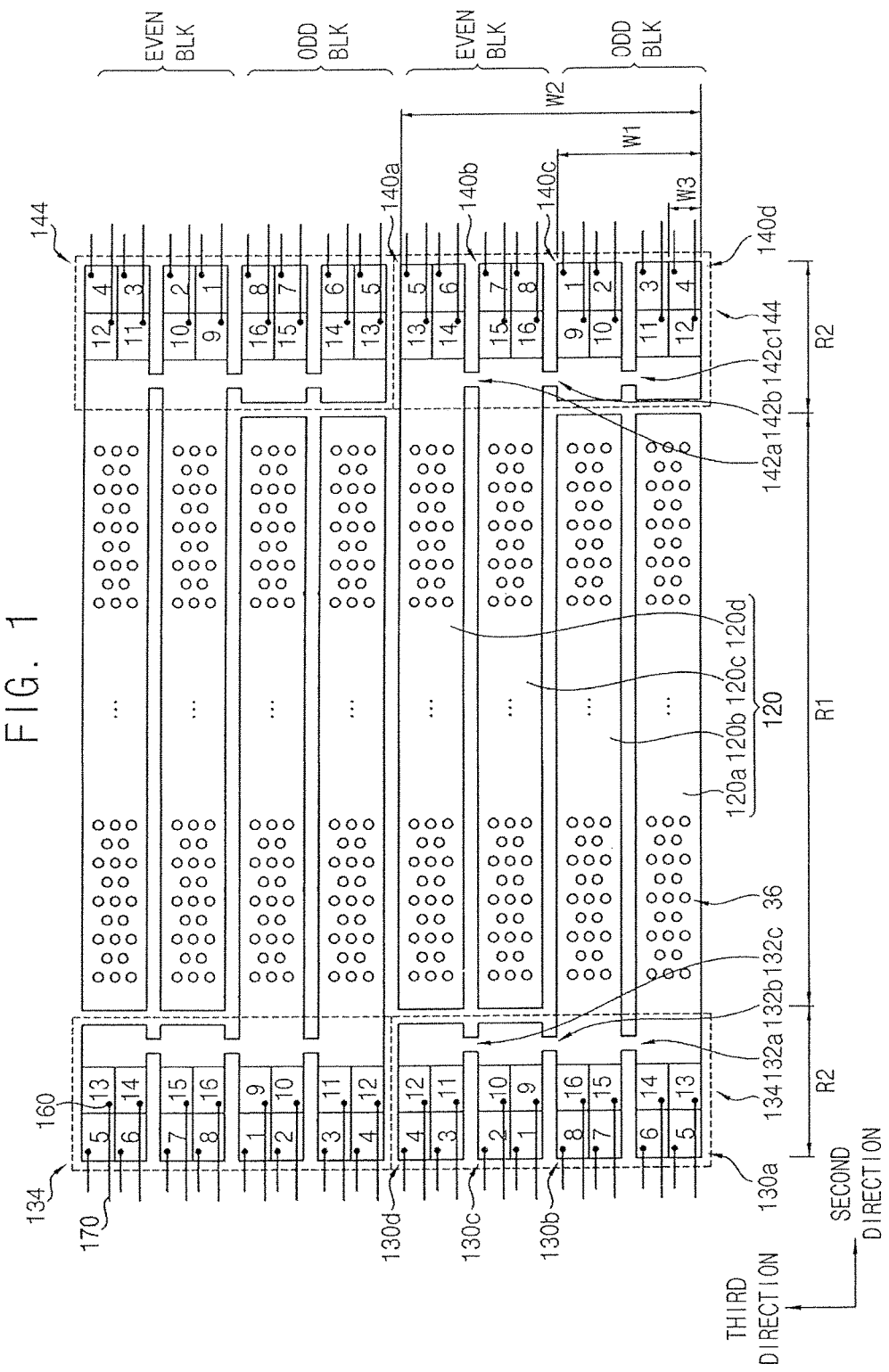
FIGS. 1, 2 and 3 are plan and perspective views illustrating a vertical semiconductor device according to an exemplary embodiment of the present inventive concept.
Figure 2:
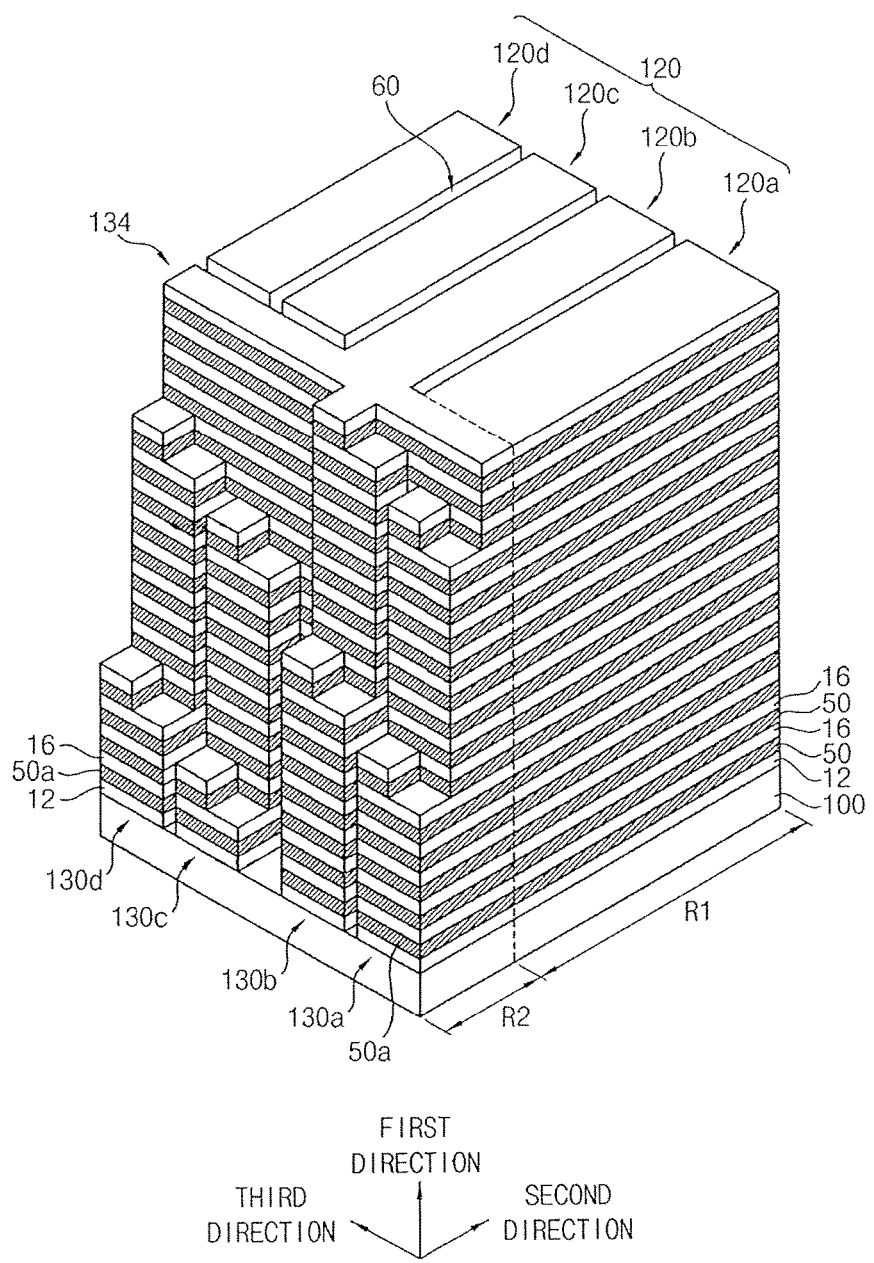
Figure 3:
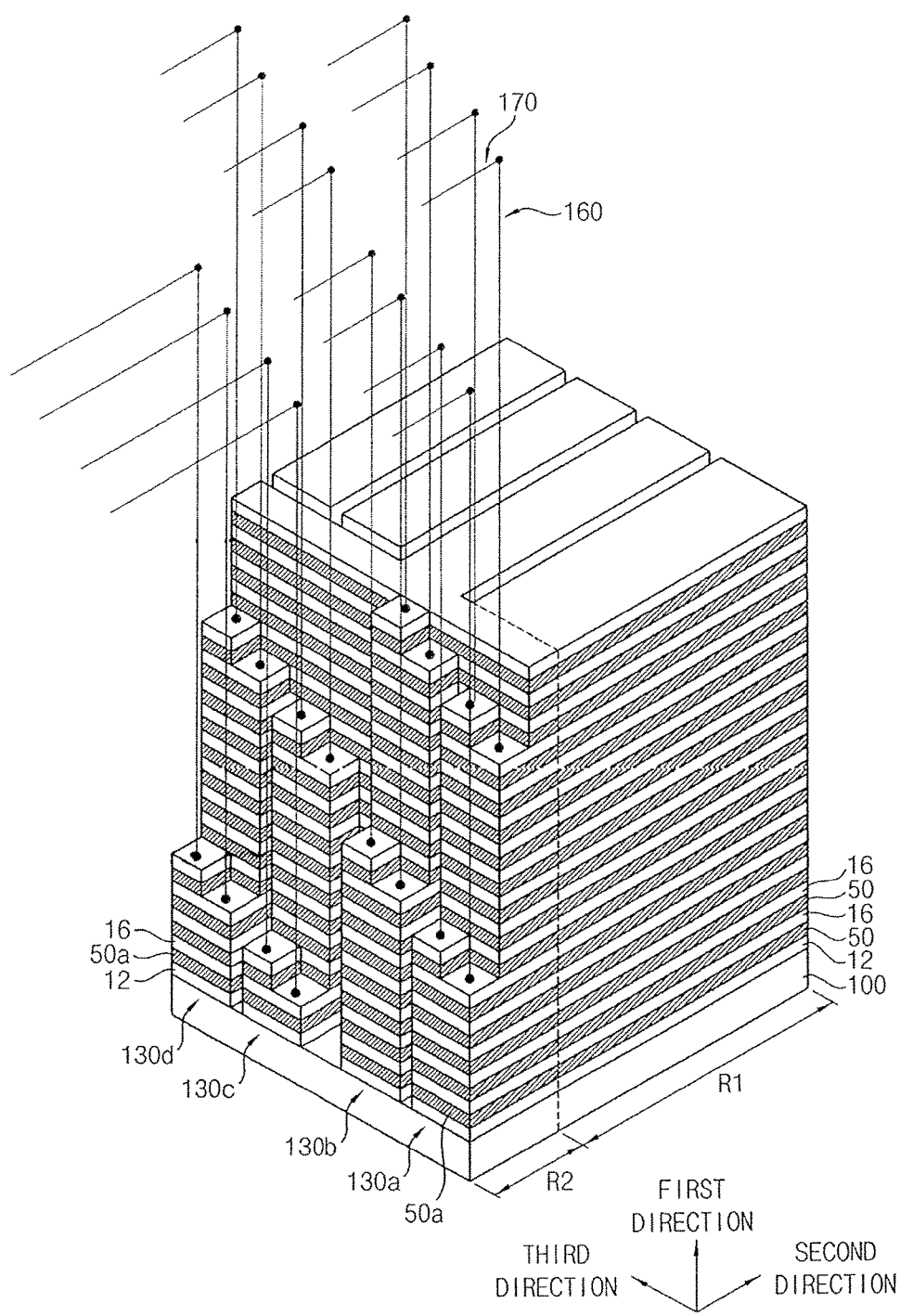

FIGS. 1 to 3 are plan and perspective views illustrating a vertical semiconductor device according to an exemplary embodiment of the present inventive concept.

FIG. 1 is a plan view of the vertical semiconductor device. FIG. 2 is a perspective view showing a portion of a pad structure in the vertical semiconductor device. FIG. 3 is a perspective view showing an electrical connection between the pad structure and a wiring structure in the vertical semiconductor device.

Referring to FIGS. 1, 2 and 3, a substrate 100 may include a first region R1 and a second region R2. The first region R1 may be a cell region on which memory cells may be arranged in three-dimensions, and the second region R2 may be a pad region on which a plurality of pads may be formed. In an exemplary embodiment of the present inventive concept, the second region R2 may be positioned at opposite sides of the first region R1 in a second direction. The memory cells may include a conductive line structure 120, and the conductive line structure 120 may be formed on the first region R1. Pad structures 134 and 144 may be formed on the second regions R2, respectively. The pad structures 134 and 144 may connect conductive lines 50 included in the conductive line structure 120 with wiring lines 170.

The substrate 100 may be a semiconductor substrate, e.g., a silicon substrate, a germanium substrate or a silicon-germanium substrate.

The conductive line structure 120 on the first region R1 may include the conductive lines 50 and insulation layers 16 alternately and repeatedly stacked in a first direction substantially perpendicular to an upper surface of the substrate 100. For example, the first direction is substantially perpendicular to the second direction. Thus, the conductive lines 50 may be spaced apart from each other in the first direction by the insulation layers 16. The conductive line structure 120 may extend in the second direction from one side of the first region R1 to an opposite side of the first region R1 toward the second region R2. In an exemplary embodiment of the present inventive concept, a plurality of conductive line structures 120 may be spaced apart from each other in a third direction substantially perpendicular to the second direction.

At least two of the conductive line structures 120 adjacent to each other in the third direction may form one cell block. Thus, for example, first, second, . . . to n-th cell blocks may be arranged in the third direction. In an exemplary embodiment of the present inventive concept, each cell block may include two conductive line structures 120 disposed in the third direction.

Hereinafter, two conductive line structures 120 included in an odd cell block may be referred to as first and second conductive line structures 120a and 120b. Two conductive line structures 120 included in an even cell block may be referred to as third and fourth conductive line structures 120c and 120d.

The conductive lines 50 may serve as a ground selection line (GSL), a string selection line (SSL), or word lines between the GSL and the SSL.

The conductive line 50 may include a metal. In an exemplary embodiment of the present inventive concept, the conductive line 50 may include a metal pattern and a barrier pattern. The metal pattern may include, e.g., tungsten (W), copper (Cu), cobalt (Co), aluminum (Al), etc., and the barrier pattern may include, e.g., titanium (Ti), titanium nitride, tantalum (Ta), tantalum nitride, etc. In an exemplary embodiment of the present inventive concept, the conductive line 50 may include, e.g., polysilicon.

The pad structures 134 and 144 may be adjacent to opposite edge portions, respectively, of the conductive line structure 120 in the first region R1. In an exemplary embodiment of the present inventive concept, the pad structures 134 and 144 may each refer to an odd block pad structure 134 and an even block pad structure 144. The odd block pad structure 134 may be connected with the first and second conductive line structures 120a and 120b included in the odd cell block. The even block pad structure 144 may be connected with the third and fourth conductive line structures 120c and 120d included in the even cell block.

Each of the pad structures 134 and 144 may include conductive patterns 50a and insulation layers 16 alternately and repeatedly stacked. The conductive patterns 50a and the conductive lines 50 in the conductive line structure 120 may be a single structure. The conductive patterns 50a and the conductive lines 50 may include substantially the same material. The insulation layers 16 included in the pad structures 134 and 144 and the insulation layers 16 included in the conductive line structure 120 may be a single structure, which may include substantially the same material.

An edge portion of each of the pad structures 134 and 144 may have a shape similar to a staircase shape. In the edge portions of the pad structures 134 and 144, upper surfaces of the conductive patterns 50a may serve as pads for contacting contact plugs, respectively. In an exemplary embodiment of the present inventive concept, the number of the pads in each of the pad structures 134 and 144 may be substantially the same as the number of the conductive lines 50 sequentially stacked in the first region R1.

Hereinafter, the odd block pad structure 134 will be described.

The odd block pad structure 134 may include first, second, third and fourth pad pattern structures 130a, 130b, 130c and 130d. The first, second, third and fourth pad pattern structures 130a, 130b, 130c and 130d may be connected with first edge portions of the first and second conductive line structures 120a and 120b, which may be, for example, disposed at left sides of the first and second conductive line structures 120a and 120b. However, the present inventive concept is not limited thereto. For example, the first edge portions of the first and second conductive line structures 120a and 120b may be disposed at right sides of the first and second conductive line structures 120a and 120b. In addition, the odd block pad structure 134 may include connecting structures 132a, 132b and 132c connecting neighboring ones of the first, second, third and fourth pad pattern structures 130a, 130b, 130c and 130d to each other.

The first and second pad pattern structures 130a and 130b may extend away from the first edge portions of the first and second conductive line structures 120a and 120b to the second region R2. In other words, the first conductive line structure 120a and the first pad pattern structure 130a may be a single structure, and thus, the first conductive line structure 120a and the first pad pattern structure 130a may be connected to each other.

The second conductive line structure 120b and the second pad pattern structure 130b may be a single structure, and thus, the second conductive line structure 120b and the second pad pattern structure 130b may be connected to each other.

The third and fourth pad pattern structures 130c and 130d may be spaced apart from the first edge portions of the third and fourth conductive line structures 120c and 120d adjacent to the second conductive line structure 120b. The conductive patterns 50a included in the third and fourth pad pattern structures 130c and 130d may be opposite to the conductive lines 50 included in the third and fourth conductive line structures 120c and 120d. For example, the conductive patterns 50a included in the third and fourth pad pattern structures 130c and 130d may be separated from the conductive lines 50 included in the third and fourth conductive line structures 120c and 120d.

In an exemplary embodiment of the present inventive concept, the first, second, third and fourth pad pattern structures 130a, 130b, 130c and 130d may be sequentially disposed in the third direction. In the plan view of FIG. 1, the first and second pad pattern structures 130a and 130b may be disposed in a lower portion, and the third and fourth pad pattern structures 130c and 130d may be disposed in an upper portion.

A first connecting structure 132a may be formed between the first and second pad pattern structures 130a and 130b. A second connecting structure 132b may be formed between the second and third pad pattern structures 130b and 130c. A third connecting structure 132c may be formed between the third and fourth pad pattern structures 130c and 130d.

The conductive patterns 50a disposed at each level in the first and second pad pattern structures 130a and 130b may be electrically connected to each other by the first connecting structure 132a. The conductive patterns 50a disposed at each level of the second and third pad pattern structures 130b and 130c may be electrically connected to each other by the second connecting structure 132b. The conductive patterns 50a disposed at each level of the third and fourth pad pattern structures 130c and 130d may be electrically connected to each other by the third connecting structure 132c.

Thus, the first, second, third and fourth pad pattern structures 130a, 130b, 130c and 130d may be connected to each other. In addition, the first and second conductive line structures 120a and 120b may be connected with the first, second, third and fourth pad pattern structures 130a, 130b, 130c and 130d through the first, second and third connecting structures 132a, 132b and 132c.

The odd block pad structure 134 may be positioned adjacent to the first edge portions of the first, second, third and fourth conductive line structures 120a, 120b, 120c and 120d. For example, the third and fourth pad pattern structures 130c and 130d are opposite the first edge portions of the third and fourth conductive line structures 120c and 120d.

A region, on which the first and second conductive line structures 120a and 120b constituting one odd block ODD BLK may be formed, may have a first width W1 in the third direction. A region for forming the odd block pad structure 134 may have a second width W2 in the third direction greater than the first width W1. In an exemplary embodiment of the present inventive concept, the second width W2 may be about two times greater than the first width W1.

Thus, the number of steps that may be formed in the third direction on the region for forming the odd block pad structure 134 may increase, in comparison to the number of steps that may be formed in the third direction on a region for forming an odd block pad structure having the first width W1 in the third direction. As the number of the steps in the third direction is increased, the number of the steps in the second direction may decrease. Thus, a width in the second direction of the region (e.g., the second region R2) for forming the odd block pad structure 134 may decrease.

In addition, second edge portions of the first and second conductive line structures 120a and 120b, which may be, for example, respectively disposed at right sides of the first and second conductive line structures 120a and 120b in the second direction, may be disposed in the first region R1, and might not extend into the second region R2. The second edge portions of the first and second conductive line structures 120a and 120b may each have vertical slopes. The first edge portions of the first and second conductive line structures 120a and 120b may be connected to the odd block pad structure 134 and may extend into the second region R2. The second edge portions opposite the first edge portions of the first and second conductive line structures 120a and 120b might not be connected to the even block pad structure 144.

In an exemplary embodiment of the present inventive concept, in a plan view, the first and second conductive line structures 120a and 120b, and the first, second, third and fourth pad pattern structures 130a, 130b, 130c and 130d may have an "L"-like shape. For example, the first and second conductive line structures 120a and 120b may extend up from a surface of the substrate 100, and the first, second, third and fourth pad pattern structures 130a, 130b, 130c and 130d may extend along the surface of the substrate 100.

Hereinafter, the even block pad structure 144 may be described.

The even block pad structure 144 may include fifth, sixth, seventh and eighth pad pattern structures 140a, 140b, 140c and 140d. The fifth, sixth, seventh and eighth pad pattern structures 140a, 140b, 140c and 140d may be connected with the second edge portions of the third and fourth conductive line structures 120c and 120d, which may be, for example, disposed at right sides of the third and fourth conductive line structures 120c and 120d. However, the present inventive concept is not limited thereto. For example, the first edge portions of the first and second conductive line structures 120a and 120b may be disposed at left sides of the first and second conductive line structures 120a and 120b. In addition, the even block pad structure 144 may include connecting structures 142a, 142b and 142c connecting the fifth, sixth, seventh and eighth pad pattern structures 140a, 140b, 140c and 140d to each other.

The fifth and sixth pad pattern structures 140a and 140b may extend in the second direction from the second edge portions of the third and fourth conductive line structures 120c and 120d to the second region R2. In other words, the third conductive line structure 120c and the sixth pad pattern structure 140b may be a single structure, and thus, the third conductive line structure 120c and the sixth pad pattern structure 140b may be connected to each other. The fourth conductive line structure 120d and the fifth pad pattern structure 140a may be a single structure, and thus, the fourth conductive line structure 120d and the fifth pad pattern structure 140a may be connected to each other.

The seventh and eighth pad pattern structures 140c and 140d may be spaced apart from the second edge portions of the first and second conductive line structures 120a and 120b adjacent to the third conductive line structure 120c.

The seventh and eighth pad pattern structures 140c and 140d may extend in the second direction. The conductive patterns 50a included in the seventh and eighth pad pattern structures 140c and 140d may be opposite to the conductive lines 50 included in the second and first conductive line structures 120b and 120a. For example, the conductive patterns 50a included in the seventh and eighth pad pattern structures 140c and 140d may be separated from the conductive lines 50 included in the first and second conductive line structures 120a and 120b. In an exemplary embodiment of the present inventive concept, the fifth, sixth, seventh and eighth pad pattern structures 140a, 140b, 140c and 140d may be sequentially disposed in the third direction. In the plan view of FIG. 1, the seventh and eighth pad pattern structures 140c and 140d may be disposed in a lower portion, and the fifth and sixth pad pattern structures 140a and 140b may be disposed in an upper portion.

A fourth connecting structure 142a may be formed between the fifth and sixth pad pattern structures 140a and 140b. A fifth connecting structure 142b may be formed between the sixth and seventh pad pattern structures 140b and 140c. A sixth connecting structure 142c may be formed between the seventh and eighth pad pattern structures 140c and 140d. Thus, the fourth, fifth and sixth connecting structures 142a, 142b and 142c and the fifth, sixth, seventh and eighth pad pattern structures 140a, 140b, 140c and 140d may be electrically connected to each other. In addition, the third and fourth conductive line structures 120c and 120d may be connected with the fifth, sixth, seventh and eighth pad pattern structures 140a, 140b, 140c and 140d through the fourth, fifth and sixth connecting structures 142a, 142b and 142c.

The even block pad structure 144 may be positioned adjacent to the second edge portions of the first, second, third and fourth conductive line structures 120a, 120b, 120c and 120d.

A region, on which the third and fourth conductive line structures 120c and 120d constituting one even block EVEN BLK may be formed, may have the first width W1 in the third direction. A region for forming the even block pad structure 144 electrically connected to the third and fourth conductive line structures 120c and 120d may have the second width W2 in the third direction.

The second width W2 may be greater than the first width W1. Thus, the number of steps that may be formed in the third direction on the region for forming the even block pad structure 144 may increase, in comparision to the number of steps that may be formed in the third direction on a region for forming an even block pad structure having the first width W1 in the third direction. As the number of steps in the third direction is increased, the number of steps in the second direction may decrease. Thus, a width in the second direction of the region for forming the even block pad structure 144 may decrease.

The first edge portions of the third and fourth conductive line structures 120c and 120d may be disposed at the first region RE and might not extend to the second region R2. The second edge portions of the third and fourth conductive line structures 120c and 120d may be connected to the even block pad structure 144 and may extend into the second region R2. The first edge portions of the third and fourth conductive line structures 120c and 120d might not be connected to the even block pad structure 144. Thus, in a plan view, the third and fourth conductive line structures 120c and 120d and the fifth, sixth, seventh and eighth pad pattern structures 140a, 140b, 140c and 140d may have a shape like an upside-down "L". For example, an "⌐" shape.

Each of the odd and even block pad structures 134 and 144 may have the steps in each of the second and third directions.

In an exemplary embodiment of the present inventive concept, one pad pattern structure included in the odd block pad structure 134 may have at least two steps in the third direction. For example, referring to FIGS. 1 to 3, one pad pattern structure included in the odd block pad structure 134 may have two steps in the third direction. As an additional example, the two steps of a pad pattern structure (e.g. 130a to 130d) may have a width in the third direction substantially the same as that of a conductive line structure (e.g., 120a and 120b). In this case, the number of steps in the third direction in the odd block pad structure 134 may be 4 times the number of the conductive line structures in the odd block ODD BLK (e.g., the first and second conductive line structures 120a and 120b). In other words, the odd block pad structure 134 may include 8 steps in the third direction.

In an exemplary embodiment of the present inventive concept, each pad pattern structure may include the two steps in the third direction, and another two steps in the third direction that are adjacent to the previous two steps. Accordingly, the odd block pad structure 134 may include 16 steps in the second and third directions.

One pad pattern structure (e.g. 140a to 140d) included in the even block pad structure 144 may have at least two steps in the third direction. For example, referring to FIGS. 1 to 3, the one pad pattern structure (e.g. 140a to 140d) included in the even block pad structure 144 may have two steps in the third direction.

A channel structure 36 may be formed through the conductive line structures 120.

Figure 11:
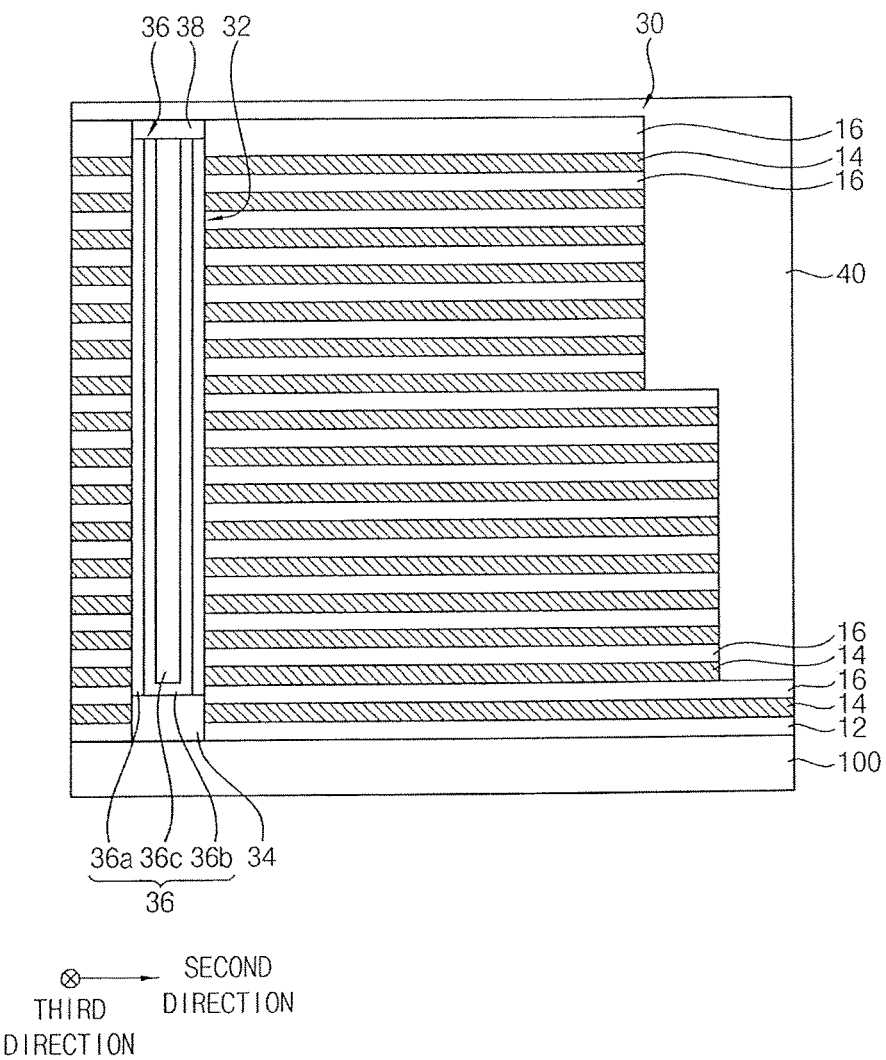

Referring to FIG. 11, the channel structure 36 may include a channel 36b, a dielectric layer structure 36a and a filling insulation pattern 36c. In an exemplary embodiment of the present inventive concept, a semiconductor pattern 34 may be formed between the channel structure 36 and the substrate 100. The channel 36b may have a cylindrical shape or a cup-like shape. The channel 36b may include polysilicon or single crystalline silicon. A portion of the channel 36b may be doped with p-type impurities, e.g., boron. The filling insulation pattern 36c may fill an inner portion of the channel 36b. The filling insulation pattern 36c may include an insulating material, e.g., silicon oxide. In an exemplary embodiment of the present inventive concept, the channel 36b may have a shape similar to a pillar. In this case, no filling insulation pattern may be formed. The dielectric layer structure 36a may surround an outer sidewall of the channel 36b. The dielectric layer structure 36a may include a tunnel insulation layer, a charge storage layer and a blocking layer sequentially stacked on the outer sidewall of the channel 36b. The blocking layer may include silicon oxide or a metal oxide, e.g., hafnium oxide, aluminum oxide, etc. The charge storage layer may include a nitride, e.g., silicon nitride, or a metal oxide. The tunnel insulation layer may include an oxide, e.g., silicon oxide. The semiconductor pattern 34 may include, e.g., single crystal silicon or polysilicon. An upper conductive pattern 38 may include, e.g., polysilicon, and may be formed on the channel structure 36. The upper conductive pattern 38 may be electrically connected to a conductive line, e.g., a bit line.

An insulating interlayer 40 may cover the conductive line structures 120 and the pad structures 134 and 144.

The contact plug 160 may extend through the insulating interlayer 40, and may contact each pad in the pad structures 134 and 144.

A wiring line 170 may contact a portion of the contact plug 160. In an exemplary embodiment of the present inventive concept, the wiring line 170 may extend in the second direction.

When the wiring line 170 has a straight-line shape, a plurality of wiring lines 170 may correspond to the number of steps in the second direction in the pad structures 134 and 144, and each wiring line 170 may be disposed at one step having a third width W3 in the third direction. Referring to FIGS. 1 to 3, when two steps in the second direction are formed, two wiring lines 170 may be formed at the two steps, respectively, having the third width W3 in the third direction.

However, a region for forming the pad structure 134 and 144 may be extended in the third direction, so that the number of the steps in the second direction and the corresponding wiring lines 170 may decrease. Thus, this may facilitate ease in the arranging of the wiring lines 170 on a pad of a step.

Shapes and arrangements of steps in the odd and even block pad structures might not be limited to the above description.

Figure 4:
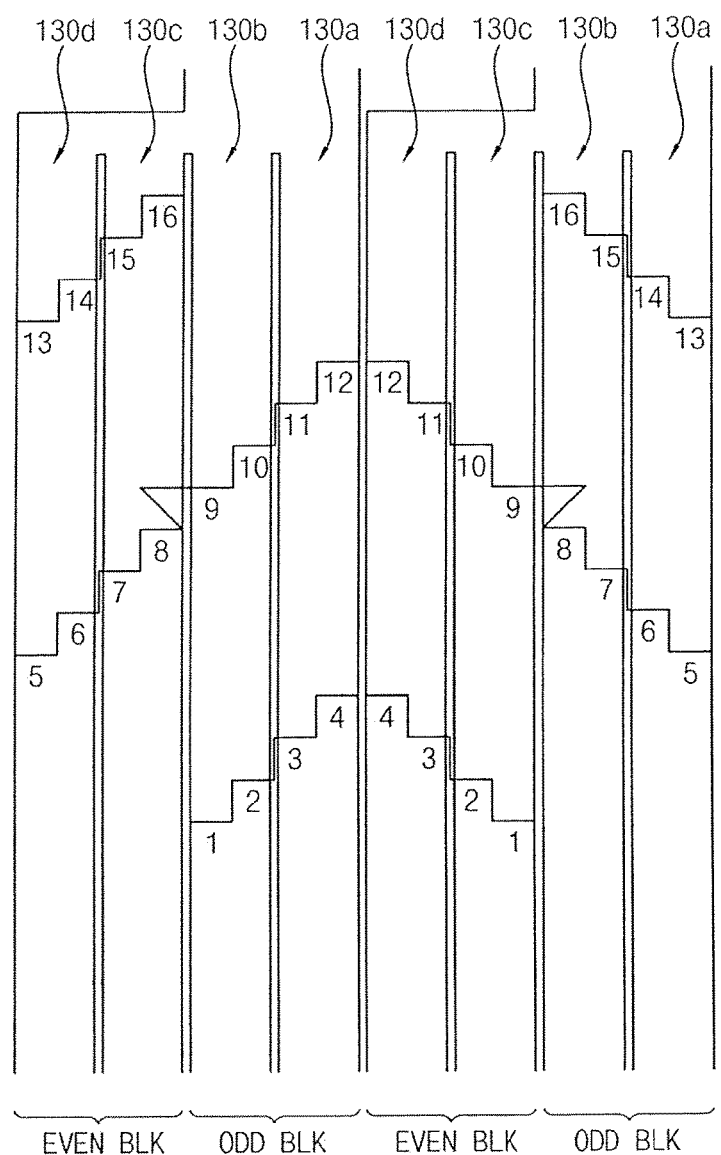
FIGS. 4 and 5 illustrate an arrangement of levels of an odd block pad structure in a vertical semiconductor device according to an exemplary embodiment of the present inventive concept.

FIG. 4 illustrates an arrangement of steps in the odd block pad structure shown in FIG. 1 according to an exemplary embodiment of the present inventive concept.

Referring to FIG. 4, the steps of the odd block pad structure 134 are linearly symmetrical to steps of a neighboring odd block pad structure 134. For example, in a lower odd block pad structure 134, the first pad pattern structure 130a may include pads at a fifth, a sixth, a thirteenth and a fourteenth level, and the second pad pattern structure 130b may include pads at a seventh, an eighth, a fifteenth and a sixteenth level. The third pad pattern structure 130c may include pads at a first, a second, a ninth and a tenth level, and the fourth pad pattern structure 130d may include pads at a third, a fourth, an eleventh and a twelfth level. In an upper odd block pad structure 134, the first pad pattern structure 130a may include pads at a fourth, a third, a twelfth and an eleventh level, and the second pad pattern structure 130b may include pads at a second, a first, a tenth and a ninth level. The third pad pattern structure 130c may include pads at an eighth, a seventh, a sixteenth and a fifteenth level, and the fourth pad pattern structure 130d may include pads at a sixth, a fifth, a fourteenth and a thirteenth level.

Figure 5:
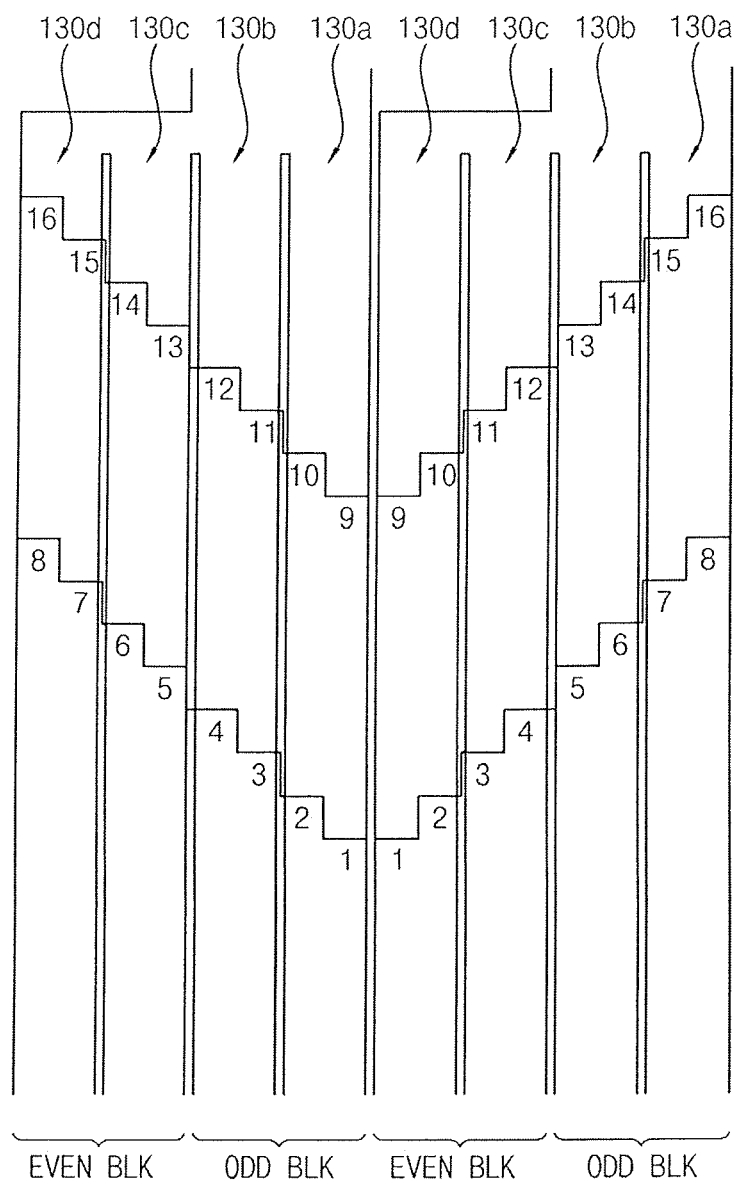

FIG. 5 illustrates an arrangement of steps in an odd block pad structure 134 in a vertical semiconductor device according to an exemplary embodiment of the present inventive concept.

Referring to FIG. 5, the steps of the odd block pad structure 134 are linearly symmetrical to steps of a neighboring odd block pad structure 134. For example, in a lower odd block pad structure 134, the first pad pattern structure 130a may include pads at seventh, eighth, fifteenth and sixteenth levels. The second pad pattern structure 130b may include pads at fifth, sixth, thirteenth and fourteenth levels. The third pad pattern structure 130c may include pads at third, fourth, eleventh and twelfth levels. The fourth pad pattern structure 130d may include pads at first, second, ninth, and tenth levels. In an upper odd block pad structure 134, the first pad pattern structure 130a may include pads at first, second, ninth, and tenth levels. The second pad pattern structure 130b may include pads at third, fourth, eleventh and twelfth levels. The third pad pattern structure 130c may include pads at fifth, sixth, thirteenth and fourteenth levels. The fourth pad pattern structure 130d may include pads at seventh, eighth, fifteenth and sixteenth levels.

Figure 6:
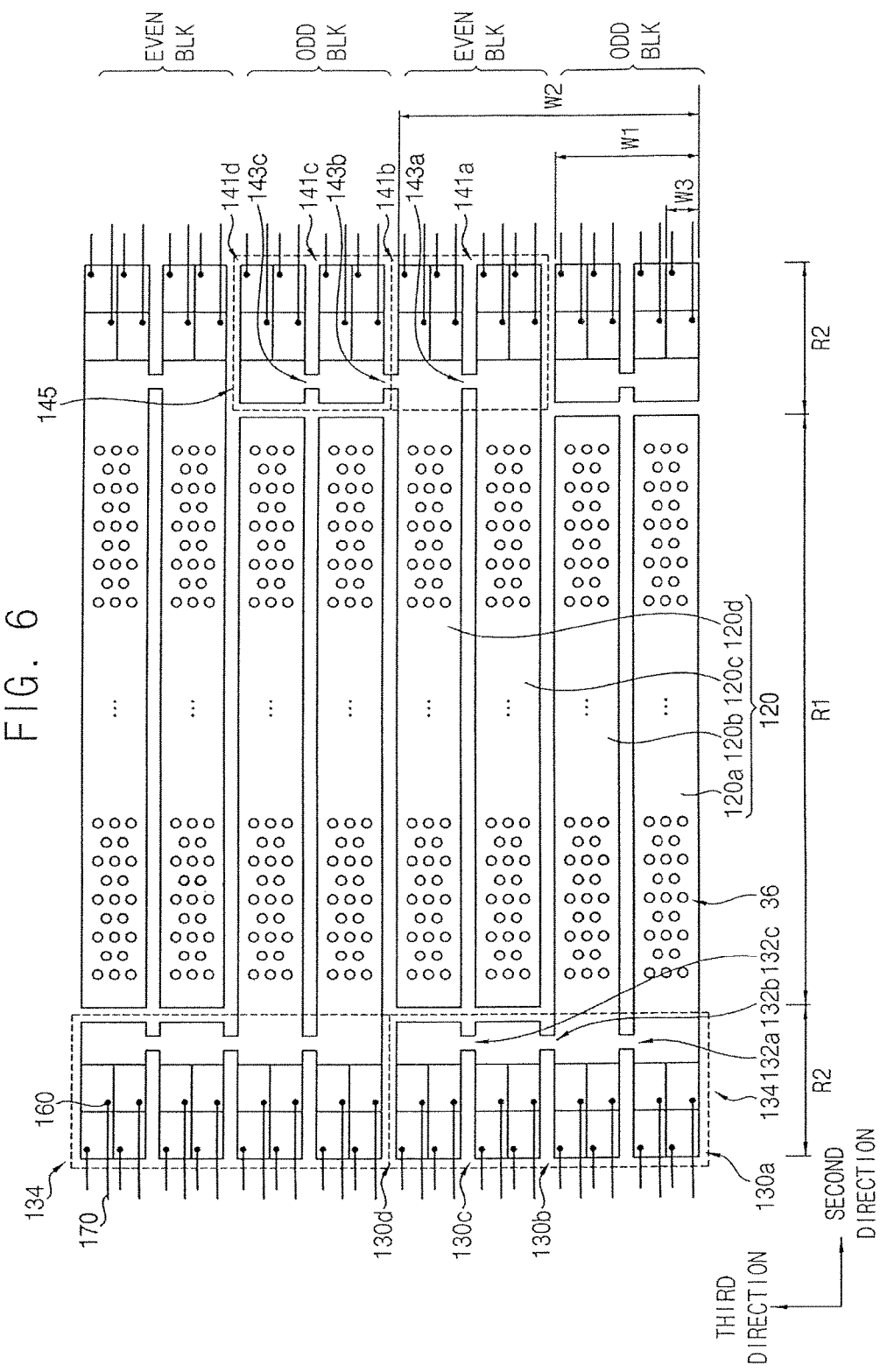
FIG. 6 is a plan view illustrating a vertical semiconductor device according to an exemplary embodiment of the present inventive concept.

FIG. 6 is a plan view illustrating a vertical semiconductor device according to an exemplary embodiment of the present inventive concept.

The vertical semiconductor device may be substantially the same as the vertical semiconductor device shown in FIGS. 1 to 3, except for shapes of pad structures in a plan view.

Referring to FIG. 6, the first and second conductive line structures 120a and 120b may be formed in an odd block ODD BLK. The third and fourth conductive line structures 120c and 120d may be formed in an even block EVEN BLK. The odd block pad structure 134 may be connected with the first and second conductive line structures 120a and 120b. An even block pad structure 145 may be connected with the third and fourth conductive line structures 120c and 120d. The first, second, third and fourth conductive line structures 120a, 120b, 120c and 120d and the odd block pad structure 134 may be substantially the same as those illustrated with reference to FIGS. 1 to 3, respectively.

The even block pad structure 145 may include fifth, sixth, seventh and eighth pad pattern structures 141a, 141b, 141c and 141d, and fourth, fifth and sixth connecting structures 143a, 143b and 143c.

The fifth pad pattern structure 141a and the third conductive line structure 120c may be a single structure, and the sixth pad pattern structure 141b and the fourth conductive line structure 120d may be a single structure. The seventh pad pattern structure 141c may be spaced apart from the second edge portion of the first conductive line structure 120a. The eighth pad pattern structure 141d may be spaced apart from the second edge portion of the second conductive line structure 120b. In other words, the seventh and eighth pad structures 141c and 141d may be disposed at an upper portion of the even block pad structure 145, from a plan view in the third direction, while the fifth and sixth pad pattern structures 141a and 141b may be disposed at a lower portion of the even block pad structure 145, from the plan view. Thus, in the plan view, the third and fourth conductive line structures 120c and 120d, and the fifth, sixth, seventh and eighth pad pattern structures 141a, 141b, 141c and 141d may have a shape similar to a reverse "L". For example, an "⌐" shape.

Figure 7:
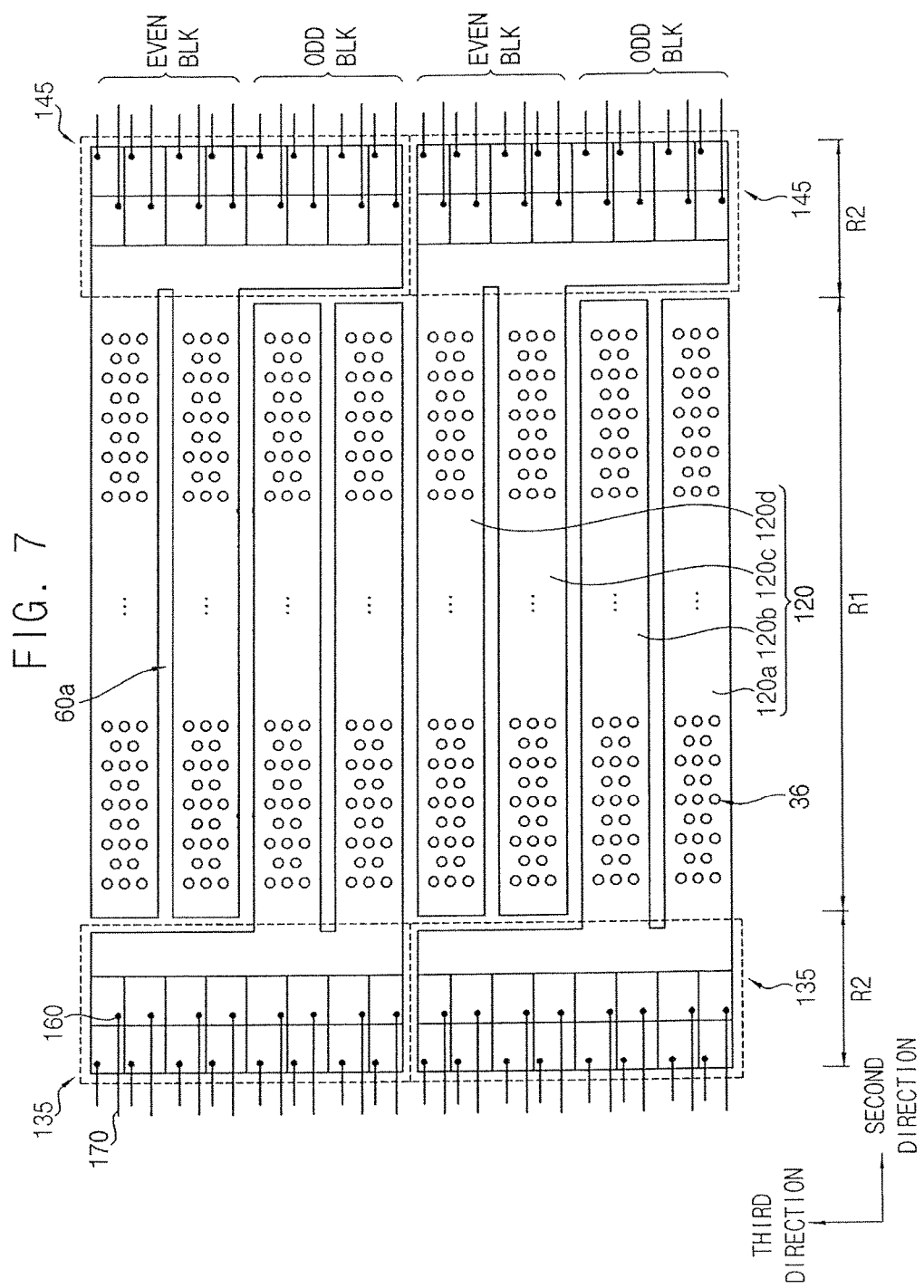
FIG. 7 is a plan view illustrating a vertical semiconductor device according to an exemplary embodiment of the present inventive concept.

FIG. 7 is a plan view illustrating a vertical semiconductor device according to an exemplary embodiment of the present inventive concept.

The vertical semiconductor device may be substantially the same as the vertical semiconductor device shown in FIGS. 1 to 3, except for shapes of pad structures in a plan view.

Referring to FIG. 7, the first and second conductive line structures 120a and 120b may be formed in an odd block ODD BLK. The third and fourth conductive line structures 120c and 120d may be formed in an even block EVEN BLK. An odd block pad structure 135 may be connected with the first and second conductive line structures 120a and 120b. The even block pad structure 145 may be connected with the third and fourth conductive line structures 120c and 120d. The first, second, third and fourth conductive line structures 120a, 120b, 120c and 120d may be substantially the same as those illustrated with reference to FIGS. 1 to 3, respectively.

The odd block pad structure 135 may be connected with the first edge portions of the first and second conductive line structures 120a and 120b. The odd block pad structure 135 may be provided for the conductive lines 50 (see, e.g., FIG. 7) included in the first and second conductive line structures 120a and 120b to connect to a wiring.

The odd block pad structure 135 may contact the first edge portions of the first and second conductive line structures 120a and 120b. The odd block pad structure 135 may be spaced apart from the first edge portions of the third and fourth conductive line structures 120c and 120d.

Thus, the odd block pad structure 135 may be formed in the second region R2 adjacent to the first edge portions of the first, second, third and fourth conductive line structures 120a, 120b, 120c and 120d.

An edge portion of the odd block pad structure 135 may have a staircase shape. An upper surface of each step in the odd block pad structure 135 may serve as a pad for contacting the contact plug 160. The steps of the odd block pad structure 135 might not include an opening 60a extending in the second direction.

In an exemplary embodiment of the present inventive concept, the odd block pad structure 135 may include steps in each of the second and third directions.

The even block pad structure 145 may be connected with the second edge portions of the third and fourth conductive line structures 120c and 120d. The even block pad structure 145 may be provided for the conductive lines 50 included in the third and fourth conductive line structures 120c and 120d to connect to a wiring.

The even block pad structure 145 may contact the second edge portions of the third and fourth conductive line structures 120c and 120d. The even block pad structure 145 may be spaced apart from the second edge portions of the first and second conductive line structures 120a and 120b. Thus, the even block pad structure 145 may be formed on the second region R2 adjacent to the first, second, third and fourth conductive line structures 120a, 120b, 120c and 120d.

An edge portion of the even block pad structure 145 may have a staircase shape. An upper surface of each step in even block pad structure 145 may serve as a pad for contacting the contact plug 160. The steps of the even block pad structure 145 might not include an opening 60a extending in the second direction.

FIGS. 8 to 14 are plan views and cross-sectional views illustrating stages of a method of manufacturing a vertical semiconductor device according to an exemplary embodiment of the present inventive concept.

Figure 8:
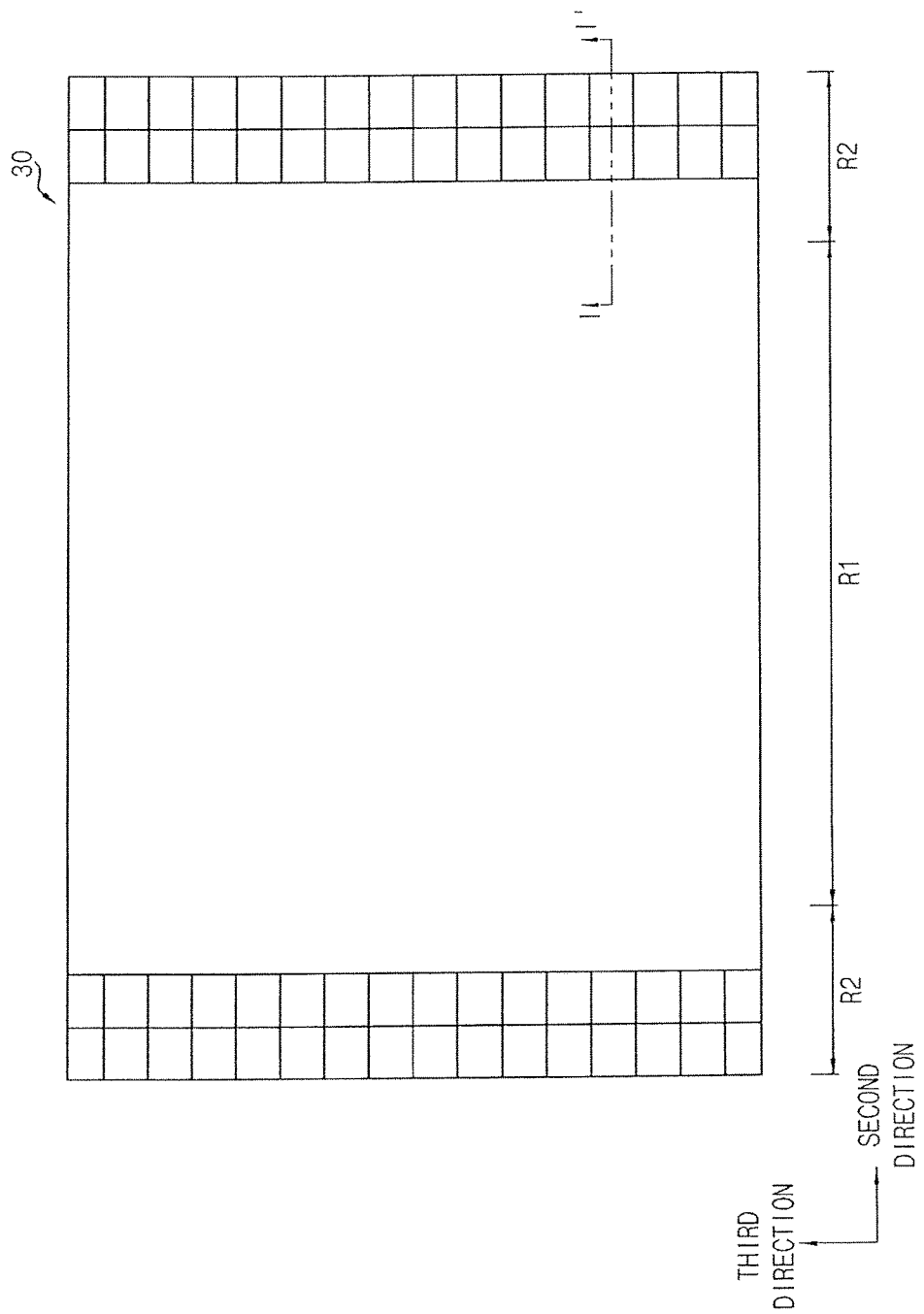
FIGS. 8, 9, 10, 11, 12, 13 and 14 are plan view and cross-sectional views illustrating stages of a method of manufacturing a vertical semiconductor device according to an exemplary embodiment of the present inventive concept.
Figure 9:
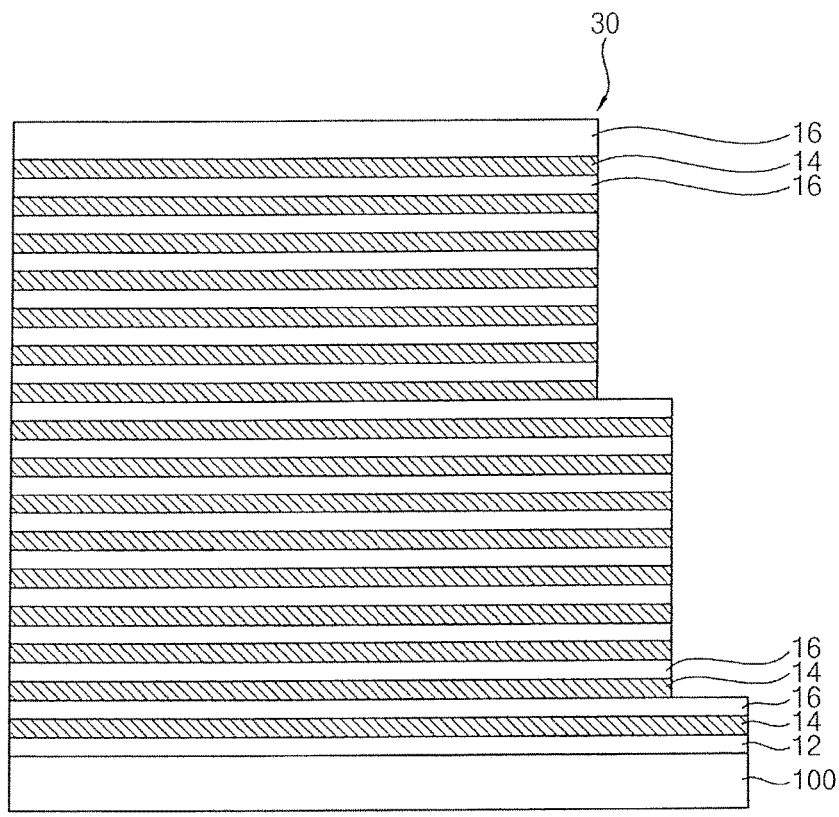
Figure 10:
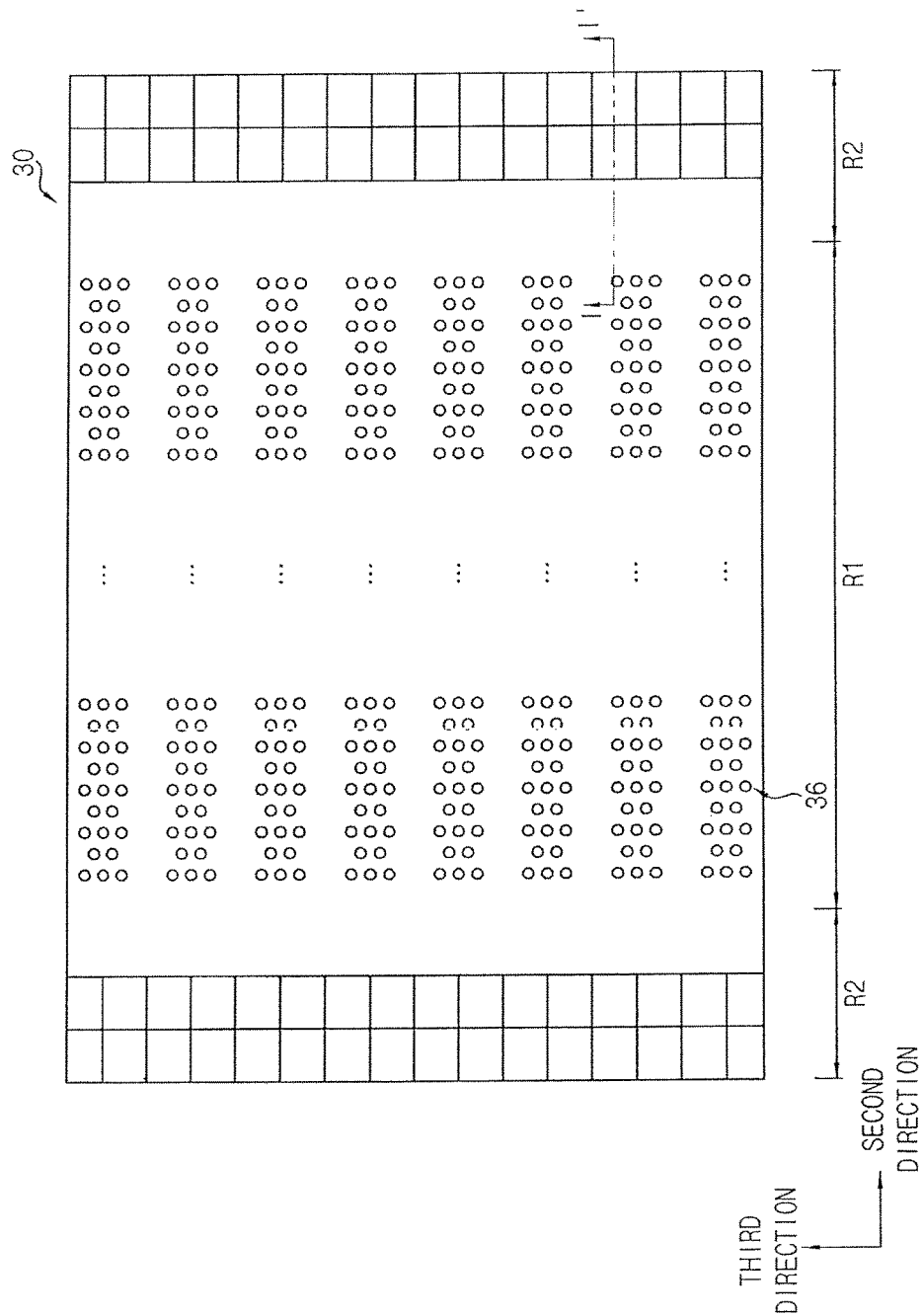
Figure 12:
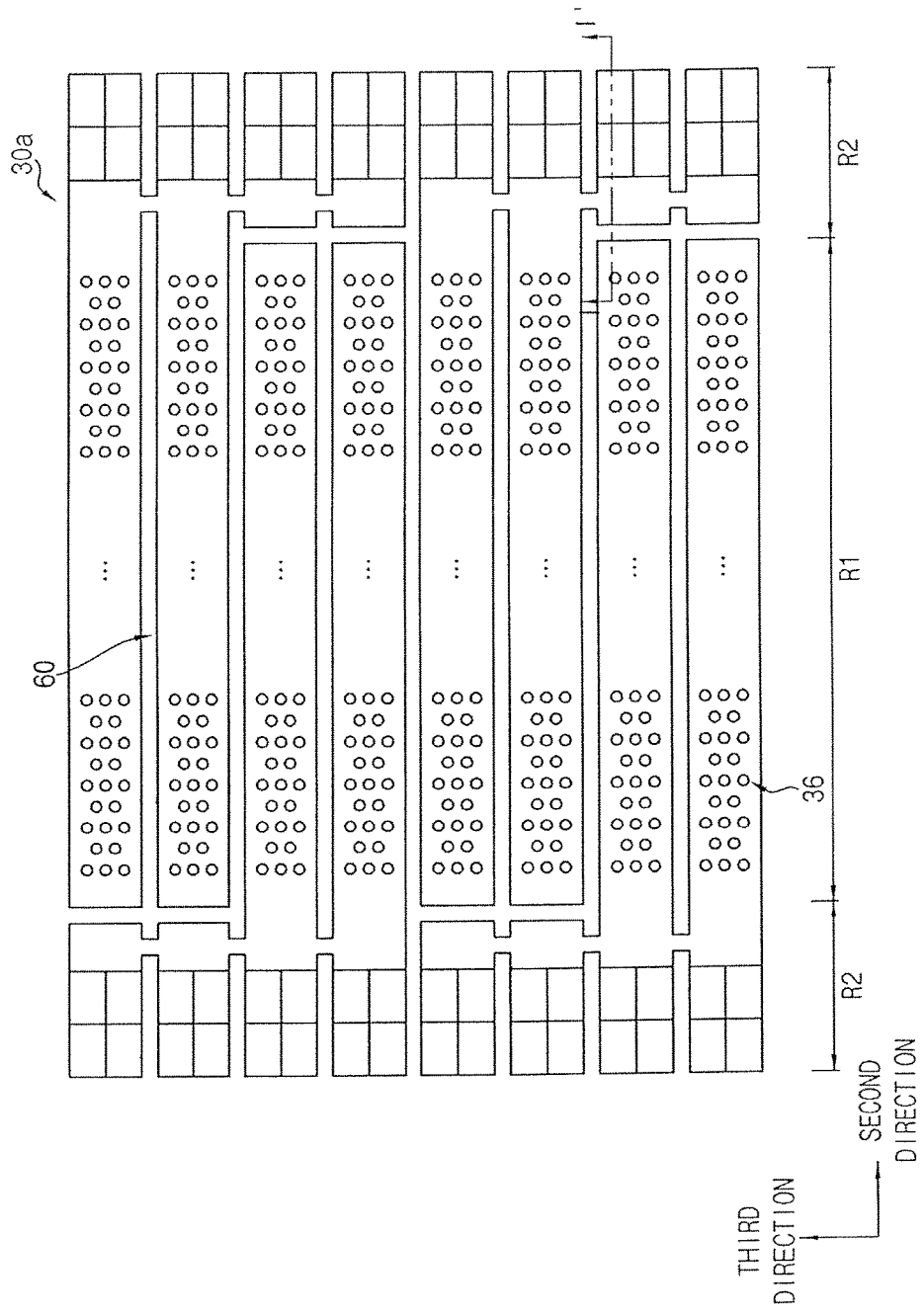

For example, FIGS. 8, 10 and 12 are plan views, and FIGS. 9, 11, 13 and 14 are cross-sectional views taken along a line I-I' of FIG. 8.

Referring to FIGS. 8 and 9, a preliminary step mold structure 30 may be formed on a substrate 100.

For example, a pad insulation layer 12 may be formed on the substrate 100. Sacrificial layers 14 and insulation layers 16 may be alternatively and repeatedly formed on the pad insulation layer 12 to form a mold structure. For example, the pad insulation layer 12 may be formed of silicon oxide. For example, the sacrificial layers 14 may be formed of a nitride, e.g., silicon nitride or borosilicate nitride (SiBN). For example, the insulation layers 16 may be formed of an oxide, e.g., silicon oxide, silicon oxycarbide (SiOC), or fluorine doped silicon oxide (SiOF).

Edge portions of the mold structure may be sequentially etched to different levels of the mold structure to form the preliminary step mold structure 30. In other words, the preliminary step mold structure 30 on the second region R2 may be etched such that steps in each of the second and third directions may be formed.

Referring to FIGS. 10 and 11, a channel structure 36 penetrating the preliminary step mold structure 30 on the first region R1 may be formed. In an exemplary embodiment of the present inventive concept, a semiconductor pattern 34 may be formed under the channel structure 36, and the semiconductor pattern 34 may contact an upper surface of the substrate 100. An insulating interlayer 40 may be formed on the preliminary step mold structure 30.

For example, the preliminary step mold structure 30 on the first region R1 may be anisotropically etched to form a channel hole 32 exposing the substrate 100. In an exemplary embodiment of the present inventive concept, the semiconductor pattern 34 may be formed by a selective epitaxial growth (SEG) process. The channel structure 36 may be formed on the semiconductor pattern 34 to fill the channel hole 32. The channel structure 36 may include a dielectric layer structure 36a, a channel 36b and a filling insulation pattern 36c. The dielectric layer structure 36a may include a tunnel insulation layer, a charge storage layer and a blocking insulation layer sequentially stacked on a surface of the channel 36b. In an exemplary embodiment of the present inventive concept, an upper conductive pattern 38 may be formed on the channel structure 36. The upper conductive pattern 38 may include, e.g., polysilicon.

The insulating interlayer 40 may be formed of an insulating material, e.g., silicon oxide.

Figure 13:
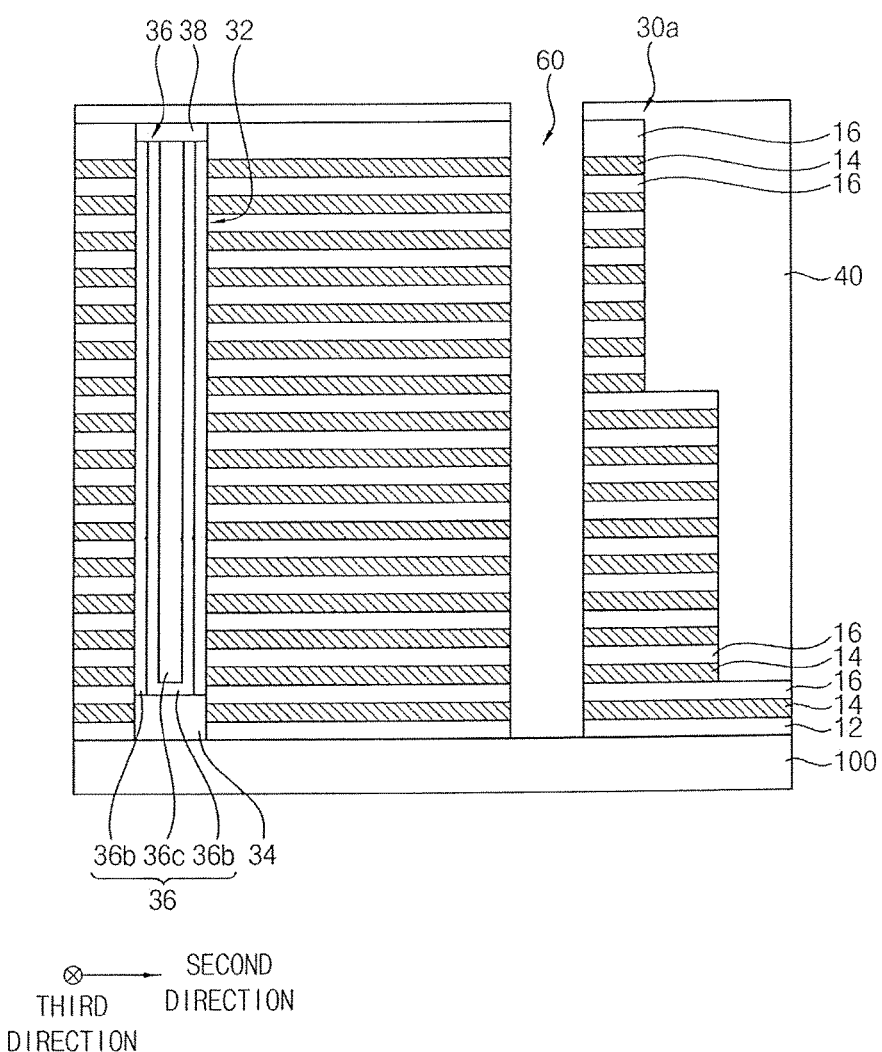
Figure 14:
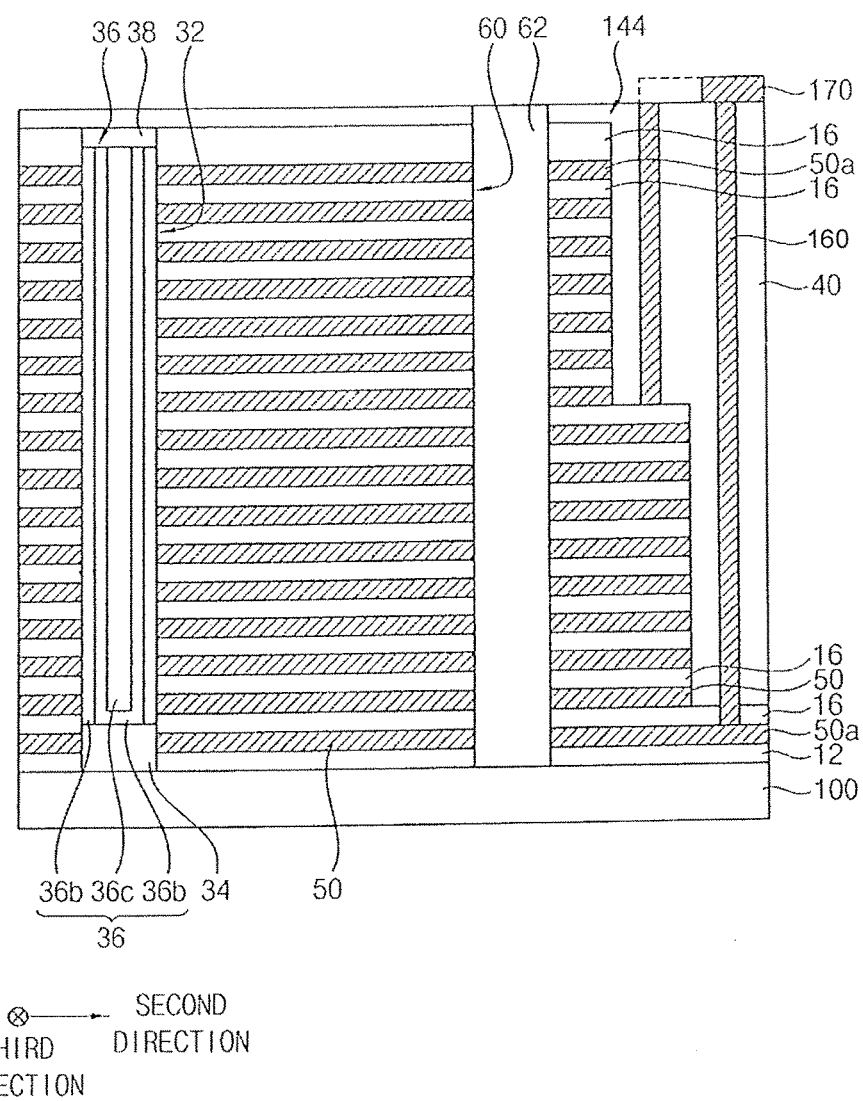

Referring to FIGS. 12 and 13, the preliminary step mold structure 30 may be etched to form a step mold structure 30a including an opening 60. The opening 60 may expose an upper surface of the substrate 100.

The opening 60 may be formed on the first and second regions R1 and R2, and may extend in the second and third directions. In an exemplary embodiment of the present inventive concept, the preliminary step mold structure 30 on the first region R1 may be cut by the opening 60. For example, the opening 60 may extend in the second direction and into the second region R2. However, portions of the preliminary step mold structure 30 may remain between openings 60 in the second region R2. As an additional example, the opening 60 may extend in the third direction and may separate a portion of the preliminary step mold structure 30 in the first region R1 from another portion of the preliminary step mold structure 30 in the second region R2. However, no opening may be formed on a portion of an interface region between the first and second regions R1 and R2. Thus, the preliminary step mold structure 30 on the interface region might not be completely cut by the opening 60, so that the step mold structure 30a may include a connecting portion on the portion of the interface region.

The step mold structure 30a on the first region R1 may be transformed into first, second, third and fourth conductive line structures by subsequent processes. The portions of the step mold structure 30a on the second region R2 may be transformed into first, second third, fourth, fifth, sixth, seventh, eighth pad pattern structures by subsequent processes. Other portions of the step mold structure 30a on the second region R2 may be transformed into first, second third, fourth, fifth, sixth connecting structures by subsequent processes.

Referring to FIGS. 1 and 14 again, the sacrificial layers 14 exposed by the opening 60 may be removed by, e.g., an isotropic etching process.

A gap between the insulation layers 16 may be formed by removing the sacrificial layers 14. A conductive material may be filled in the gap at each level to form conductive lines 50 and conductive patterns 50a in the first and second region R1 and R2, respectively.

In other words, a conductive line structure 120 including the conductive lines 50 and the insulation layers 16 alternatively stacked may be formed on the first region R1. Pad structures 134 and 144 including the conductive patterns 50a and the insulation layers 16 alternatively stacked and having a staircase shape may be formed on the second region R2. An insulation pattern 62 may be formed in the opening 60.

A contact plug 160 may be formed on each pad in the pad structures 134 and 144. The contact plug 160 may be formed through the insulating interlayer 40. For example, a contact hole may be formed to expose an upper surface of the conductive pattern 50a in the pad structures 134 and 144. A barrier layer may be formed on an inner surface of the contact hole, and a metal layer may be formed on the barrier layer to fill the contact hole. In addition, to form the contact plug 160, the, metal layer and the barrier layer may be planarized until the insulating interlayer 40 may be exposed.

A wiring line 170 may be formed on the contact plug 160 and the insulating interlayer 40, and thus, the wiring line 170 may be electrically connected to the contact plug 160. The wiring line 170 may extend in the second direction.

Figure 15:
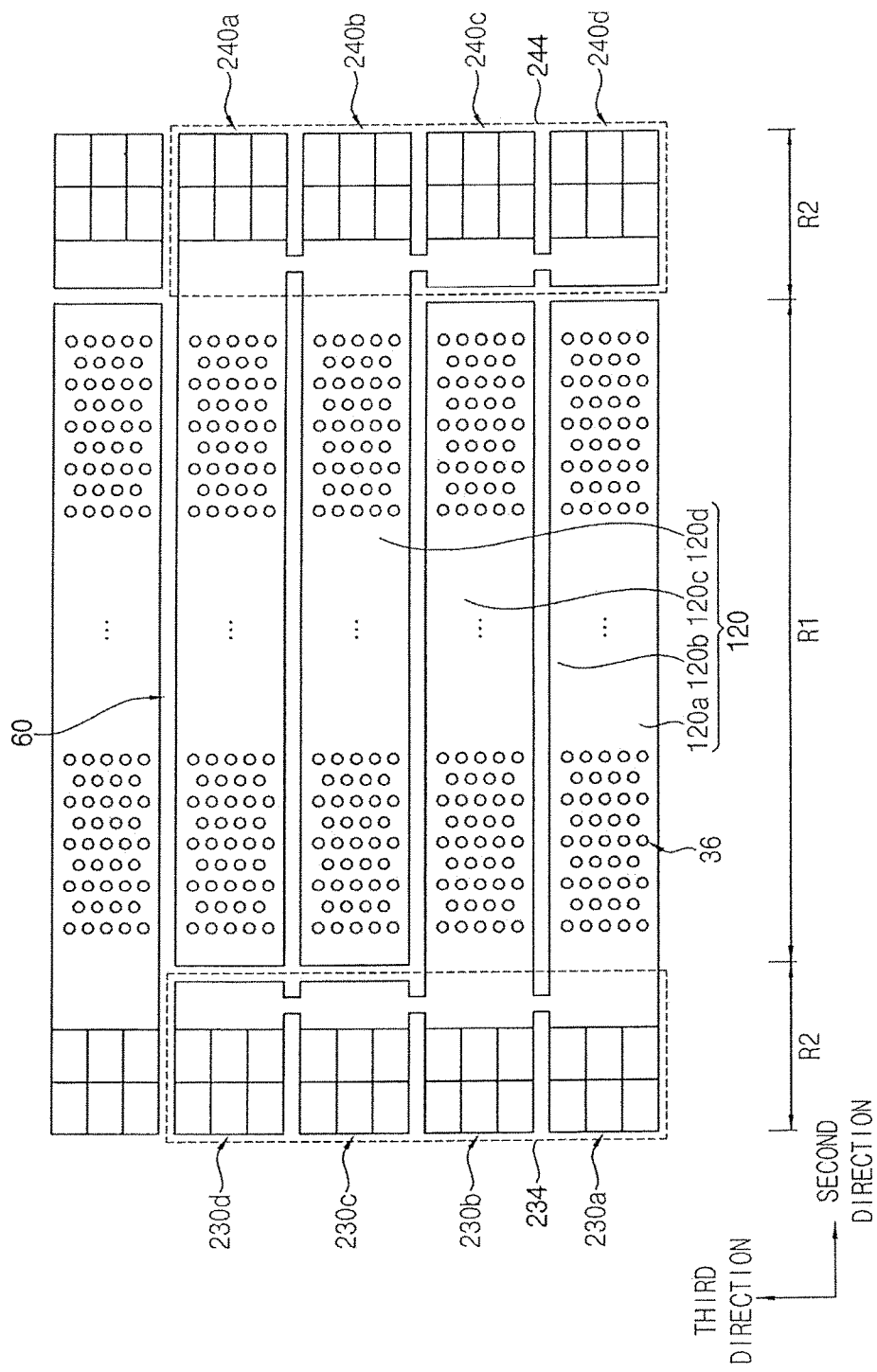
FIGS. 15 and 16 are plan and perspective views illustrating a vertical semiconductor device according to an exemplary embodiment of the present inventive concept.
Figure 16:
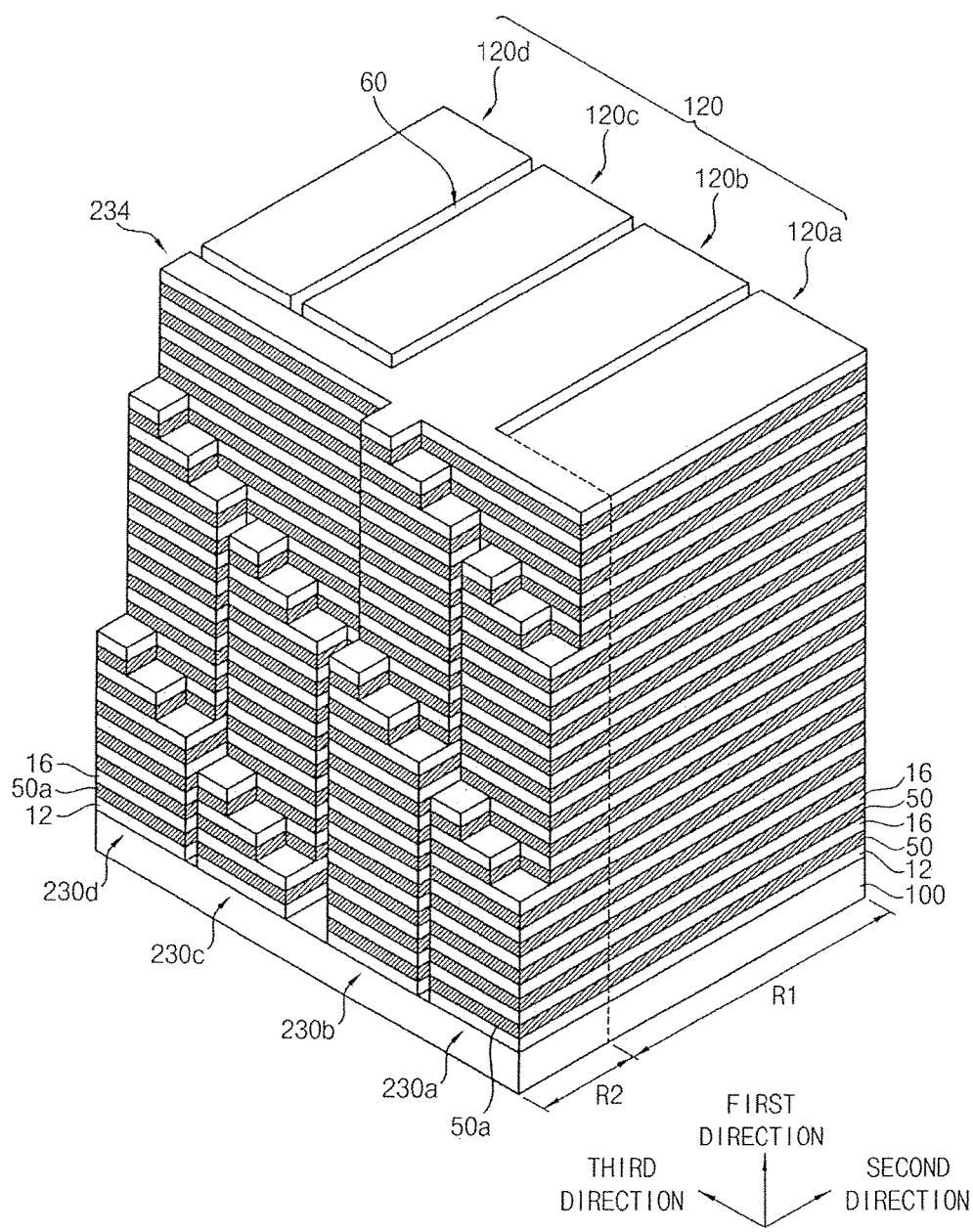

FIGS. 15 and 16 are a plan view and a perspective view, respectively, illustrating a vertical semiconductor device according to an exemplary embodiment of the present inventive concept.

The vertical semiconductor device may be substantially the same as the vertical semiconductor device shown in FIGS. 1 to 3, except for shapes of pad structures.

Referring to FIGS. 15 and 16, an odd block pad structure 234 may include steps in each of the second and third directions. In an exemplary embodiment of the present inventive concept, one pad pattern structure (e.g., 230a, 230b, 230c and 230d) included in the odd block pad structure 234 may have at least two steps in the third direction. For example, referring to FIGS. 15 and 16, one pad pattern structure (e.g., 230a, 230b, 230c and 230d) included in the odd block pad structure 234 may have three steps in the third direction. In this case, the number of steps in the third direction in the odd block pad structure 234 may be six times the number of the conductive line structures (e.g., 120a and 120b) in the odd block ODD BLK (see, e.g., FIG. 1). In other words, the odd block pad structure 234 may include 12 steps in the third direction.

An even block pad structure 244 may include steps in each of the second and third directions. In an exemplary embodiment of the present inventive concept, one pad pattern structure (e.g., 240a, 240b, 240c and 240d) included in the even block pad structure 244 may have three steps in the third direction.

Figure 17:
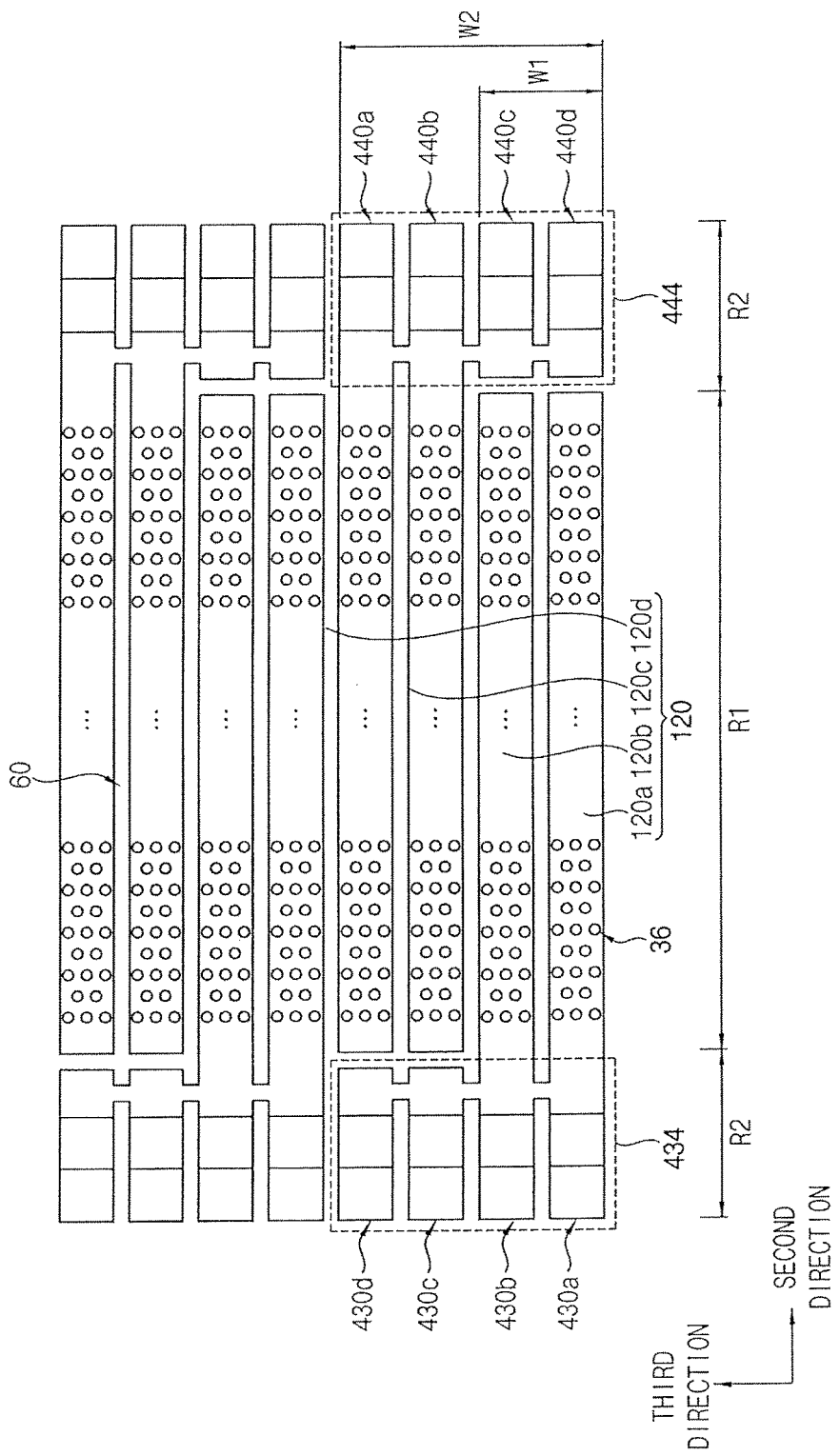
FIGS. 17 and 18 are plan and perspective views illustrating a vertical semiconductor device according to an exemplary embodiment of the present inventive concept.
Figure 18:
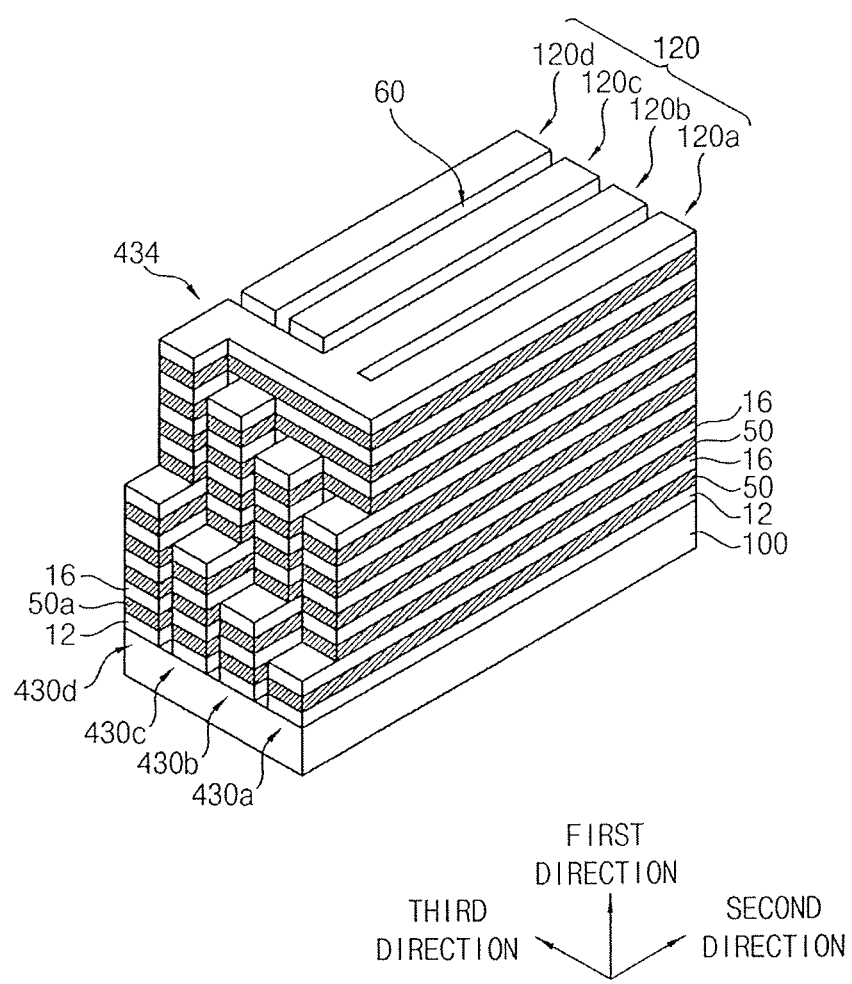

FIGS. 17 and 18 are a plan view and a perspective view, respectively, illustrating a vertical semiconductor device according to an exemplary embodiment of the present inventive concept.

The vertical semiconductor device may be substantially the same as the vertical semiconductor device shown in FIGS. 1 to 3, except for shapes of pad structures.

Referring to FIGS. 17 and 18, an odd block pad structure 434 may include steps in each of the second and third directions. In an exemplary embodiment of the present inventive concept, one pad pattern structure (e.g., 430a, 430b, 430c and 430d) included in the odd block pad structure 434 might not include a step in the third direction. In this case, the number of steps in the third direction in the odd block pad structure 434 may be 2 times the number of the conductive line structures (e.g., 120a and 120b) in the odd block ODD BLK (see, e.g., FIG. 1). In other words, the odd block pad structure 434 may include 4 steps in the third direction.

An even block pad structure 444 may include steps in each of the second and third directions. In an exemplary embodiment of the present inventive concept, one pad pattern structure (e.g., 440a, 440b, 440c and 440d) included in the even block pad structure 444 may not include a step in the third direction.

As described above, a region, on which the conductive line structures (e.g., 120a and 120b) constituting one cell block may be formed, may have the first width W1 in the third direction. A region (e.g., odd and even block pad structures 434 and 444) for forming the pad pattern structures (e.g., 430a, 430b, 430c, 430d, 440a, 440b, 440c and 440d) connected to the conductive line structures (e.g., 120a, 120b, 120c and 120d) may have the second width W2 in the third direction greater than the first width W1. Thus, the length, in the second direction, of the region (e.g., 434 and 444) for forming the pad pattern structures (e.g., 430a, 430b, 430c, 430d, 440a, 440b, 440c and 440d) may decrease. In addition, the wirings connected to the pad pattern structures (e.g., 430a, 430b, 430c, 430d, 440a, 440b, 440c and 440d) may be easily arranged.

In an exemplary embodiment of the present inventive concept, a semiconductor device including gate structures having various dimensions may be formed.

While the present inventive concept has been particularly shown and described with reference to exemplary embodiments thereof, it will be apparent to those of ordinary skill in the art that various changes in form and detail may be made thereto without departing from the spirit and scope of the present inventive concept as defined by the following claims.

What is claimed is:

1. A vertical semiconductor device, comprising:
a plurality of odd cell blocks each including a plurality of first conductive line structures on a substrate, wherein each of the first conductive line structures includes conductive lines and insulation layers alternatively stacked in a first direction substantially perpendicular to an upper surface of the substrate and extending in a second direction substantially parallel to the upper surface of the substrate;
a plurality of even cell blocks each including a plurality of second conductive line structures on the substrate between the odd cell blocks, wherein each of the second conductive line structures has substantially the same shape as that of each of the first conductive line structures, and extends in the second direction;
an odd block pad structure connected to first edge portions of the first conductive line structures on the substrate; and
an even block pad structure connected to second edge portions of the second conductive line structures on the substrate, wherein the second edge portions are opposite to the first edge portions, respectively, in the second direction,
wherein each of the odd cell blocks and each of the even cell blocks has a first width in a third direction, wherein the third direction is substantially parallel to the upper surface of the substrate and substantially perpendicular to the second direction, and
each of the odd and even block pad structures is formed on a region of the substrate having a second width greater than the first width in the third direction.

2. The vertical semiconductor device of claim 1, wherein the odd block pad structure includes:
a first group of pad structures contacting the first edge portions of the first conductive line structures and extending in the second direction;
a second group of pad structures spaced apart from third edge portions of the second conductive lines, wherein the third edge portions are opposite to the second edge portions of the second conductive lines; and
a first connection structure connecting the first group of pad structures with the second group of pad structures.

3. The vertical semiconductor device of claim 2, wherein the first group of pad structures further includes a conductive pattern, wherein the conductive pattern and the conductive lines in an odd cell block of the plurality of odd cell blocks are a single structure, and
wherein the second group of pad structures further includes a conductive pattern, wherein the conductive pattern is spaced apart from the conductive lines in an even cell block of the plurality of even cell blocks.

4. The vertical semiconductor device of claim 1, wherein the even block pad structure includes:
a third group of pad structures contacting the second edge portions of the second conductive line structures and extending in the second direction;
a fourth group of pad structures spaced apart from fourth edge portions of the first conductive lines, wherein the fourth edge portions are opposite to the first edge portions of the first conductive lines; and
a second connection structure connecting the third group of pad structures with the fourth group of pad structures.

5. The vertical semiconductor device of claim 4, wherein the third group of pad structures further includes a conductive pattern, wherein the conductive pattern and the conductive lines in an even cell block of the plurality of even cell blocks are a single structure, and
wherein the fourth group of pad structures further includes a conductive pattern, wherein the conductive pattern is spaced apart from the conductive lines in an odd cell block of the plurality of odd cell blocks.

6. The vertical semiconductor device of claim 1, wherein edge portions of the odd and even block pad structures have steps in each of the second and third directions.

7. The vertical semiconductor device of claim 6, wherein each of the odd and even block pad structures includes a plurality of groups of pad structures, wherein the groups of pad structures are aligned with each of the first and second conductive line structures and are spaced apart from each other in the third direction, and each of the groups of pad structures includes at least two steps in the third direction.

8. The vertical semiconductor device of claim 6, further comprising;
a contact plug contacting a conductive pattern of each step in the odd and even block pad structures; and
a wiring line contacting the contact plug.

9. The vertical semiconductor device of claim 1, further comprising a channel structure including a channel, a dielectric layer structure and a filling insulation pattern,
wherein the channel structure extends through the odd and even cell blocks in the first direction.

10. A vertical semiconductor device, comprising:
a plurality of odd cell blocks each including a plurality of first conductive line structures on a substrate, wherein each of the first conductive line structures includes conductive lines and insulation layers alternatively stacked in a first direction substantially perpendicular to an upper surface of the substrate and extending in a second direction substantially parallel to the upper surface of the substrate;
a plurality of even cell blocks each including a plurality of second conductive line structures on the substrate between the odd cell blocks, wherein each of the second conductive line structures has substantially the same shape as that of each of the first conductive line structures, and extends in the second direction;
an odd block pad structure aligned to the first and second conductive line structures, wherein the odd block pad structure is connected to a first edge portion of the first conductive line structure, and is spaced apart from a first edge portion of the second conductive line structure; and
an even block pad structure aligned to the first and second conductive line structures, wherein the even block pad structure is connected to a second edge portion of the second conductive line structure, and is spaced apart from a second edge portion of the first conductive line structure.

11. The vertical semiconductor device of claim 10, wherein each of the odd cell blocks and each of the even cell blocks has a first width in a third direction that is substantially parallel to the upper surface of the substrate and substantially perpendicular to the second direction, and each of the odd block pad structure and the even block pad structure is formed on a region having a second width greater than the first width in the third direction.

12. The vertical semiconductor device of claim 10, wherein edge portions of the odd and even block pad structures have steps in each of the second direction and a third direction.

13. The vertical semiconductor device of claim 12, wherein each of the odd and even block pad structures includes a plurality of groups of pad structures, wherein the groups of pad structures are aligned with each of the first and second conductive line structures and are spaced apart from each other in the third direction, and each of the groups of pad structures includes at least two steps in the third direction.

14. The vertical semiconductor device of claim 13, wherein the groups of pad structures included in the odd block pad structure are connected to each other by a first connection structure, and the groups of pad structures included in the even block pad structure are connected to each other by a second connection structure.

15. The vertical semiconductor device of claim 10, further comprising;
a contact plug contacting a conductive pattern of each steps in the odd and even block pad structures; and
a wiring line contacting the contact plug.

16. A vertical semiconductor device, comprising:
a plurality of first cell blocks each including a plurality of first conductive line structures on a substrate, wherein each of the first conductive line structures extends in a second direction and includes conductive lines and insulating layers alternatively stacked in a first direction substantially perpendicular to the second direction;
a plurality of second cell blocks each including a plurality of second conductive line structures on the substrate between the first cell blocks, wherein each of the second conductive line structures includes conductive lines and insulating layers alternatively stacked in the first direction;
a first block pad structure extending in a third direction substantially perpendicular to the second direction and including a first, a second, a third and a fourth pad pattern structure connected to each other and the first conductive line structures, wherein the first conductive line structures and the first block pad structure have an "L" shape; and
a second block pad structure extending in the third direction and including a fifth, a sixth, a seventh and an eighth pad pattern structure connected to each other and the second conductive line structures, wherein the second block pad structure is opposite the first block pad structure, and the second conductive line structures and the second block pad structure have an "L" shape.

17. The vertical semiconductor device of claim 16, wherein the first block pad structure further comprises first connecting structures connecting the first, second, third and fourth pad pattern structures to each other, and the second block pad structure further comprises second connecting structures connecting the fifth, sixth, seventh and eighth pad pattern structures to each other.

18. The vertical semiconductor device of claim 16, wherein each of the first cell blocks and each of the second cell blocks has a first width in the third direction, and each of the first block pad structure and the second block pad structure has a second width greater than the first width in the third direction.

19. The vertical semiconductor device of claim 16, wherein the first conductive line structures are spaced apart from the second conductive line structures.

20. The vertical semiconductor device of claim 16, wherein the first block pad structure is spaced apart from the second conductive line structures, and the second block pad structure is spaced apart from the first conductive line structures.

* * * * *